United States Patent
Ray et al.

(10) Patent No.: US 10,978,145 B2
(45) Date of Patent: Apr. 13, 2021

(54) PROGRAMMING TO MINIMIZE CROSS-TEMPERATURE THRESHOLD VOLTAGE WIDENING

(71) Applicant: SanDisk Technologies LLC, Addison, TX (US)

(72) Inventors: Biswajit Ray, Madison, AL (US); Peter Rabkin, Cupertino, CA (US); Mohan Dunga, Santa Clara, CA (US); Gerrit Jan Hemink, San Ramon, CA (US); Changyuan Chen, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/540,862

(22) Filed: Aug. 14, 2019

(65) Prior Publication Data
US 2021/0050054 A1 Feb. 18, 2021

(51) Int. Cl.
| | | |
|---|---|---|
| *G11C 11/56* | (2006.01) | |
| *G11C 11/408* | (2006.01) | |
| *G11C 11/407* | (2006.01) | |
| *G11C 11/406* | (2006.01) | |
| *G11C 11/4074* | (2006.01) | |

(52) U.S. Cl.
CPC ...... *G11C 11/5628* (2013.01); *G11C 11/4074* (2013.01); *G11C 11/4085* (2013.01); *G11C 11/40626* (2013.01); *G11C 11/5642* (2013.01)

(58) Field of Classification Search
CPC .......... G11C 11/5628; G11C 11/40626; G11C 11/4074; G11C 11/4085; G11C 11/5642
See application file for complete search history.

(56) References Cited

U.S. PATENT DOCUMENTS

| | | |
|---|---|---|
| 7,630,266 B2 | 12/2009 | Incarnati et al. |
| 7,706,190 B2 | 4/2010 | Yang et al. |
| 7,755,946 B2 | 7/2010 | Dunga et al. |

(Continued)

OTHER PUBLICATIONS

International Search Report & The Written Opinion of the International Searching Authority dated Jul. 13, 2020, International Application No. PCT/US2020/024109.

(Continued)

*Primary Examiner* — Tri M Hoang
(74) *Attorney, Agent, or Firm* — Vierra Magen Marcus LLP

(57) ABSTRACT

Apparatuses and techniques are provided for programming memory cells while reducing widening of a threshold voltage distribution due to changes in the temperature between the time of programming and the time of a subsequent read operation. One technique is based on a correlation between program speed and temperature coefficient (Tco). A different verify test is used for different memory cells which have a common assigned data state according to the program loop number and the temperature. Another technique is based on sensing the memory cells to measure their subthreshold slope and classifying the memory cells into groups. The sensing can occur as a separate operation before programming or as part of the programming of user data. The subsequent programming of the memory cells involves adjusting the verify test of each memory cell based on its group and the temperature.

20 Claims, 30 Drawing Sheets

(56) References Cited

U.S. PATENT DOCUMENTS

| | | |
|---|---|---|
| 8,391,070 B2 | 3/2013 | Bathul et al. |
| 8,542,537 B2 | 9/2013 | Parker |
| 8,611,157 B2 | 12/2013 | Dutta |
| 8,755,234 B2 | 6/2014 | Oowada et al. |
| 8,811,089 B2 | 8/2014 | Ueno |
| 8,929,135 B2 | 1/2015 | Tanaka et al. |
| 8,929,142 B2 | 1/2015 | Dong et al. |
| 9,530,512 B2 | 12/2016 | Ray et al. |
| 9,543,028 B2 | 1/2017 | Ray et al. |
| 9,911,498 B2 | 3/2018 | Shirakawa et al. |
| 2011/0292724 A1 | 12/2011 | Kim |
| 2012/0218823 A1 | 8/2012 | Tanzawa |
| 2013/0163342 A1 | 6/2013 | Dutta |
| 2013/0308390 A1 | 11/2013 | Lee |
| 2014/0269070 A1* | 9/2014 | Hsiung ............... G11C 16/26 365/185.11 |
| 2017/0148494 A1* | 5/2017 | Pan ..................... G11C 16/26 |
| 2017/0242632 A1* | 8/2017 | Cho ..................... G06F 7/36 |
| 2017/0309344 A1 | 10/2017 | Dutta et al. |

OTHER PUBLICATIONS

U.S. Appl. No. 15/981,024, filed May 16, 2018.
U.S. Appl. No. 16/371,289, filed Apr. 1, 2019.

* cited by examiner

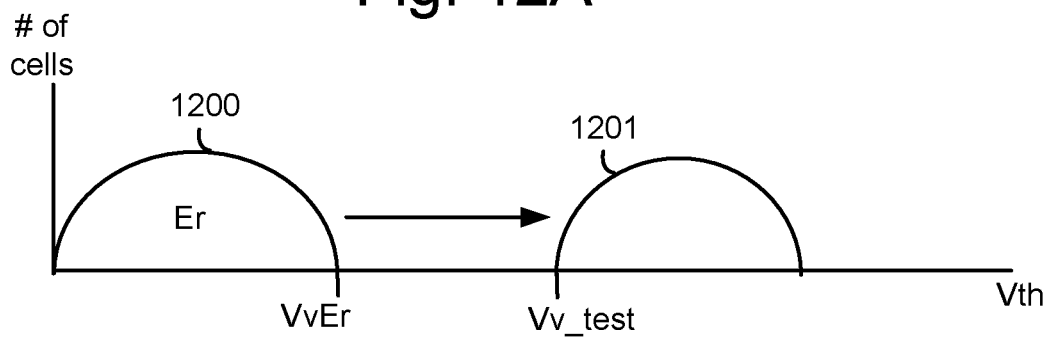
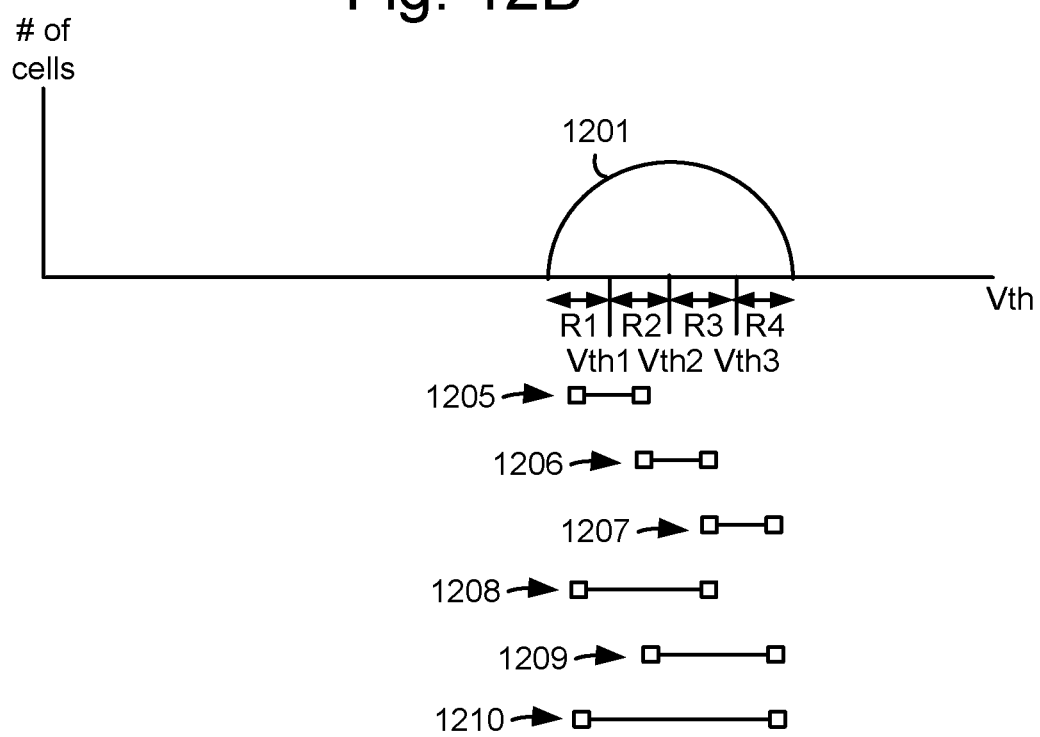

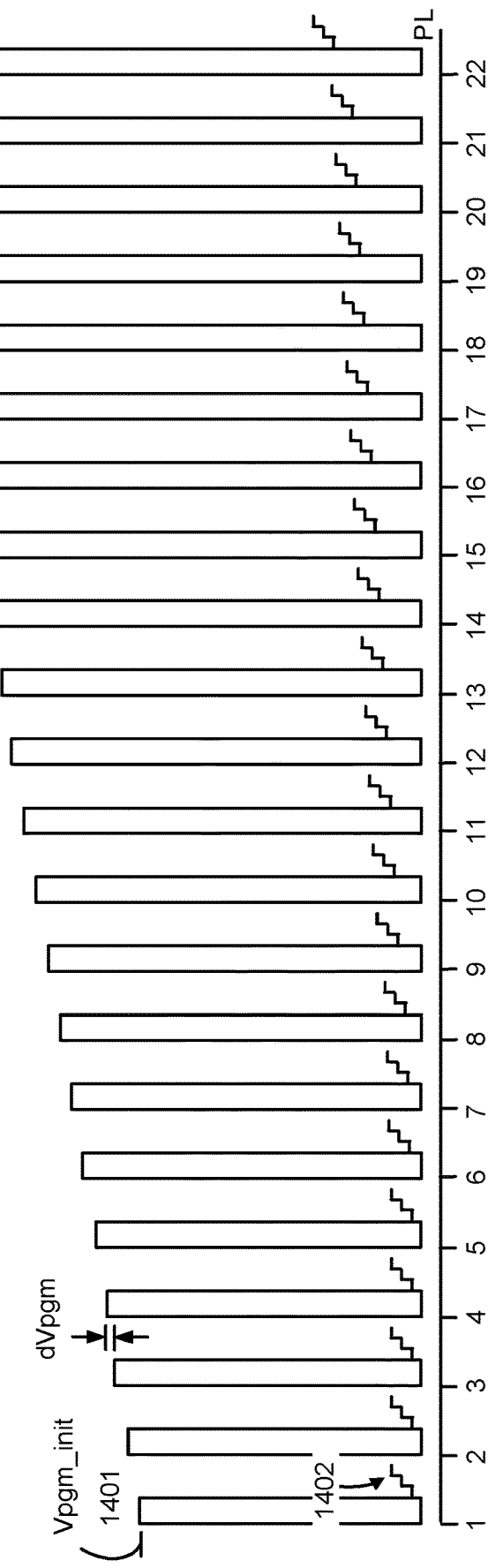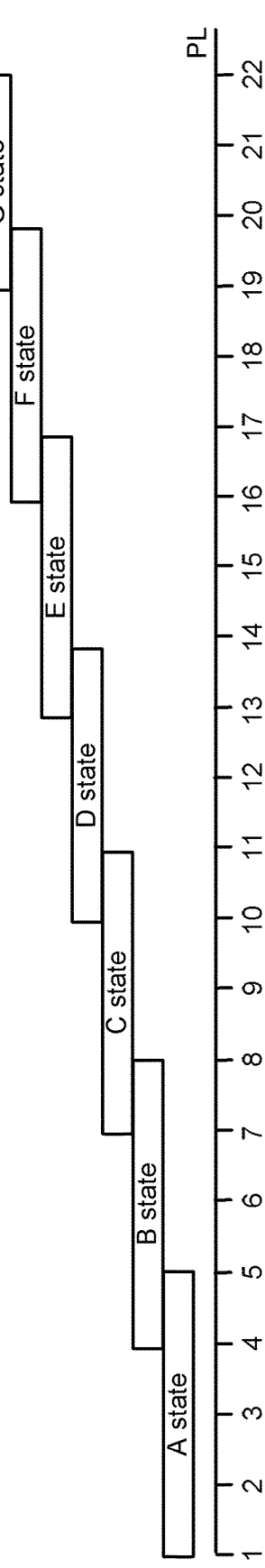

LT programming

HT programming

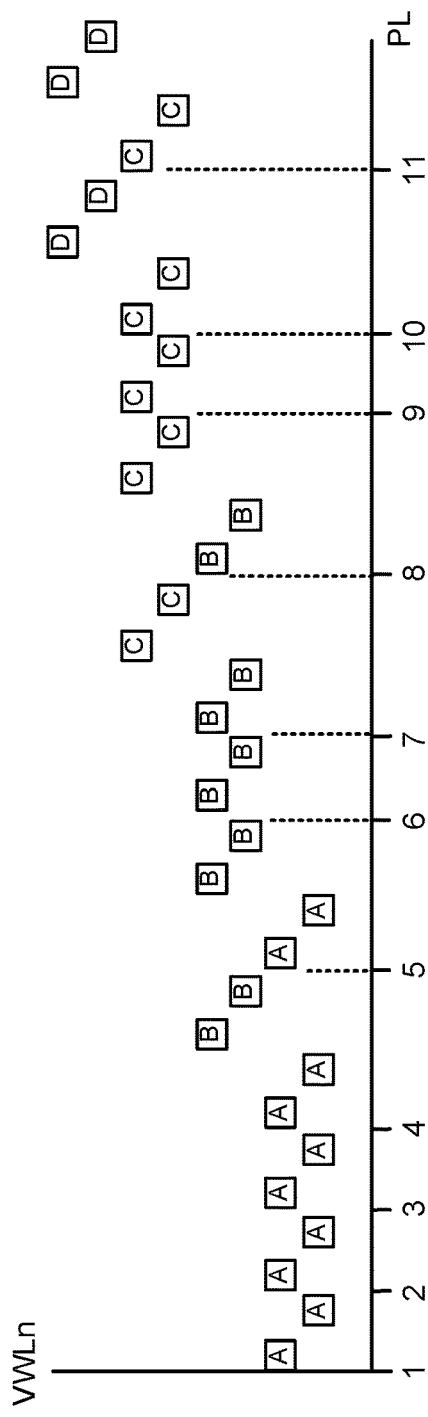
Fig. 15D1
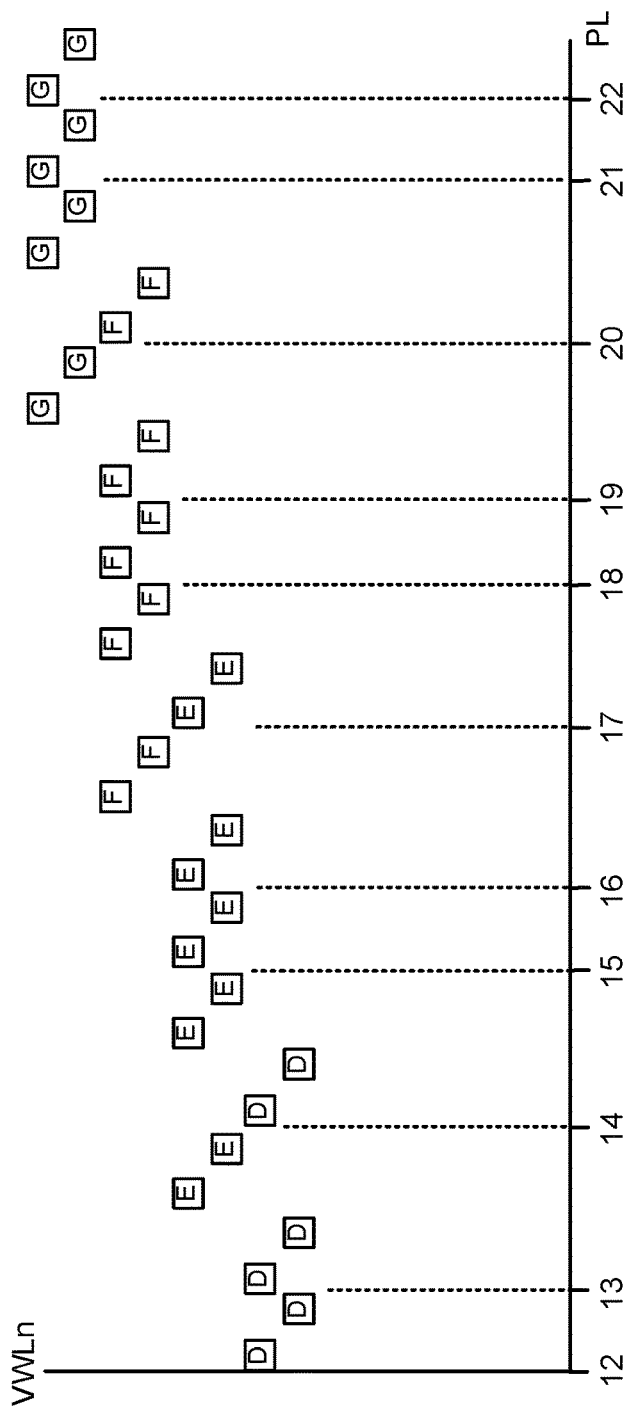
Fig. 15D2

LT programming

HT programming

LT programming

HT programming

|     | Er  | A   | B   | C   | D   | E   | F   | G   |
| --- | --- | --- | --- | --- | --- | --- | --- | --- |
| TCO | 0/1 | 0/1 | 0/1 | 0/1 | 0/1 | 0/1 | 0/1 | 0/1 |
| UP  | 1   | 1   | 1   | 0   | 0   | 0   | 0   | 1   |
| MP  | 1   | 1   | 0   | 0   | 1   | 1   | 0   | 0   |
| LP  | 1   | 0   | 0   | 0   | 0   | 1   | 1   | 1   |

Fig. 19A

|     | Er  | A   | B   | C   | D   | E   | F   | G   |
| --- | --- | --- | --- | --- | --- | --- | --- | --- |
| TCO | 0/1 | 0/1 | 0/1 | 0/1 | 0/1 | 0/1 | 0/1 | 0/1 |
| UP  | 1   | 1   | 1   | 1   | 1   | 1   | 1   | 1   |
| MP  | 1   | 1   | 1   | 1   | 1   | 1   | 1   | 1   |
| LP  | 1   | 1   | 1   | 1   | 1   | 1   | 1   | 1   |

Fig. 19B

PROGRAMMING TO MINIMIZE CROSS-TEMPERATURE THRESHOLD VOLTAGE WIDENING

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 12A depicts example Vth distributions obtained when programming memory cells to a test Vth distribution, consistent with step 1011 of FIG. 10B.

FIG. 12B depicts examples of Vth changes for the memory cells having the Vth distribution 1201 of FIG. 12A when using multiple sensing conditions, and classifying the memory cells based on the Vth changes, consistent with the processes of FIGS. 10B and 10E.

FIG. 14A depicts an example voltage signal used in a program operation, consistent with FIG. 13A.

FIG. 14B depicts an example of verify tests for different data states in different program loops of FIG. 14A.

FIG. 15D1 depicts a plot of word line verify voltage versus program loop number for use in the process of FIG. 13D, Option 4, for PL1-11.

FIG. 15D2 depicts a plot of word line verify voltage versus program loop number for use in the process of FIG. 13D, Option 4, for PL12-22.

FIG. 19A depicts an example of bit values in latches at a start of a program operation, consistent with the processes of FIG. 10B-10D, where a TCO latch is used to store data indicating the Tco classification of a memory cell.

FIG. 19B depicts bit values in latches at a completion of a program operation, consistent with FIG. 19A.

DETAILED DESCRIPTION

Apparatuses and techniques are described for programming memory cells while reducing widening of the threshold voltage (Vth) distribution due to changes in the temperature between the time of programming and the time of a subsequent read operation.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

Figure 7:
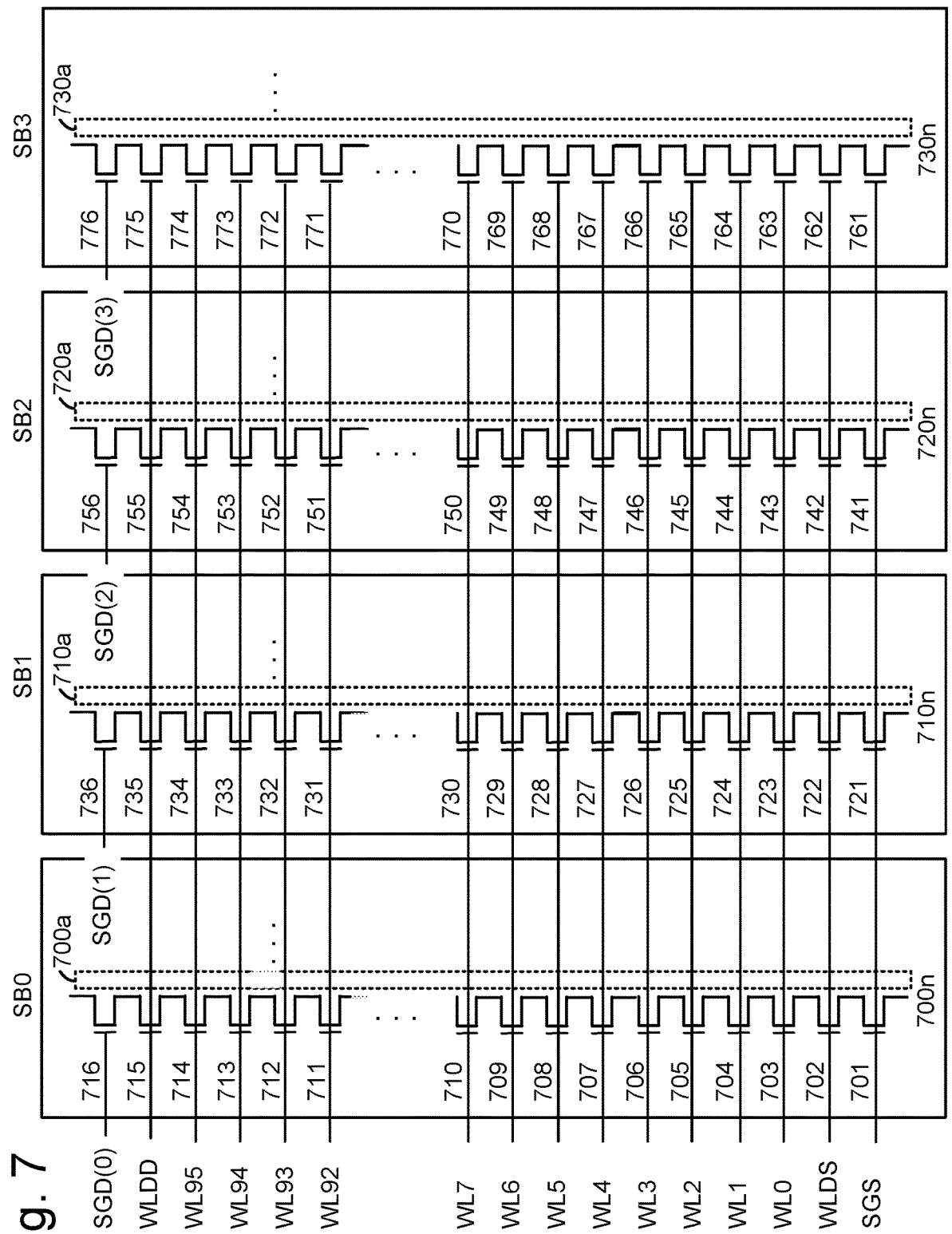
FIG. 7 depicts an example view of NAND strings in a block BLK0 which is consistent with FIGS. 4 and 6A.

After a block of memory cells is erased in an erase operation, programming can occur. During a programming operation, the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-blocks (FIG. 7). For example, a portion of the memory cells of WLn in SB0 are first programmed, followed by a portion of the memory cells of WLn in SB1, a portion of the memory cells of WLn in SB2 and then a portion of the memory cells of WLn in SB3. A programming operation may include one or more sets of increasing program voltages or pulses which are applied to a word line in respective program loops or program-verify iterations, such as depicted in FIGS. 14A and 14B. Verify tests may be performed after each program voltage to determine whether the memory cells have completed programming. When programming is completed for a memory cell, it can be locked out from further programming while programming continues for other memory cells in subsequent program loops.

Figure 14C:
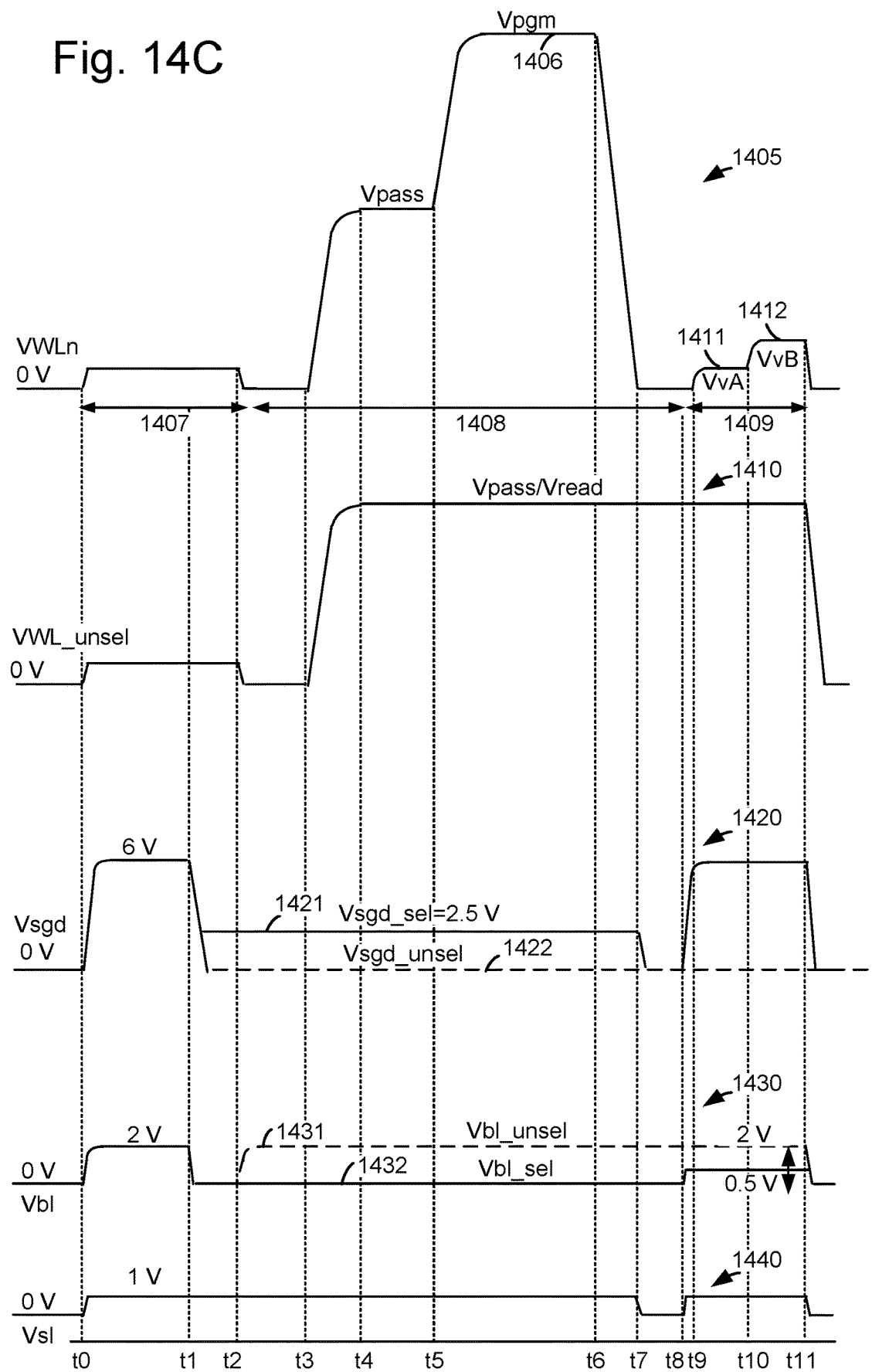
FIG. 14C depicts example voltage signals for performing the process of FIG. 13A.

A program loop can include a pre-charge phase 1407, a program phase 1408 and a verify phase 1409, as depicted in FIG. 14C.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states (see FIG. 8A). In a four-bit per cell memory device, there are sixteen data states including the erased state S0 and fifteen programmed data states S1-S15 (see FIG. 8B). Each data state can be represented by a range of threshold voltages in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

However, the Vth of a memory cell can change due to changes in the temperature between the time of programming and the time of a subsequent read operation, resulting in widening of the Vth distribution and read errors. The change in Vth with temperature can be expressed by a temperature coefficient, Tco, which is typically negative. For example, an increase in temperature will result in a decrease in Vth, and a decrease in temperature will result in an increase in Vth. An example Tco is −2 mV/C. The temperature at which the memory cells will be read after being programmed is typically unknown, so that large changes in temperature after programming can result in large changes in Vth. The Vth changes can result in widening of the Vth distribution, potentially resulting in read errors.

Techniques provided herein address the above and other issues. The techniques are based on an observation that different memory cells can have different values of Tco. These variations may be due to non-uniformities in the fabrication process, for instance, and tend to be randomly distributed.

One technique is based on a correlation between program speed and Tco, where faster programming cells have a higher Tco magnitude. See FIG. 9A. In this technique, a different verify test is used for different memory cells which have a common assigned data state according to the program loop number and the temperature. For example, the verify tests can be adjusted by adjusting the word line verify voltage, sense time and/or bit line voltage during sensing. When the programming occurs at a low temperature (LT), the verify test can use a high word line verify voltage, a high sense time and/or a high bit line voltage. When the programming occurs at a high temperature (HT), the verify test can use a low word line verify voltage, a low sense time and/or a low bit line voltage.

Another technique is based on sensing the memory cells to measure their subthreshold slope. The subthreshold slope of a memory cell can be defined as a change in control gate voltage per one decade (dec.) of change in the value of current, e.g., in units of mV/dec. This is the inverse of the slope of the plots in FIG. 9B. When the subthreshold slope is low, the Tco magnitude is low. See FIG. 9C. The sensing can occur as a separate operation before programming or as part of the programming of user data. The sensing can involve sensing the conductive or non-conductive state of a memory cell using multiple sensing conditions, e.g., bit line voltages and/or sense times, while a fixed word line verify voltage is applied. See FIGS. 12B, 12C and 12E. If the sensing detects a large change in the Vth of a memory cell, the memory cell has a high subthreshold slope and is classified as a high Tco memory cell. If the sensing detects a small change in the Vth of a memory cell, the memory cell has a low subthreshold slope and is classified as a low Tco memory cell. The subsequent programming of the memory cells involves adjusting the verify tests based on the classifications and the temperature.

These and other features are discussed further below.

Figure 1A:
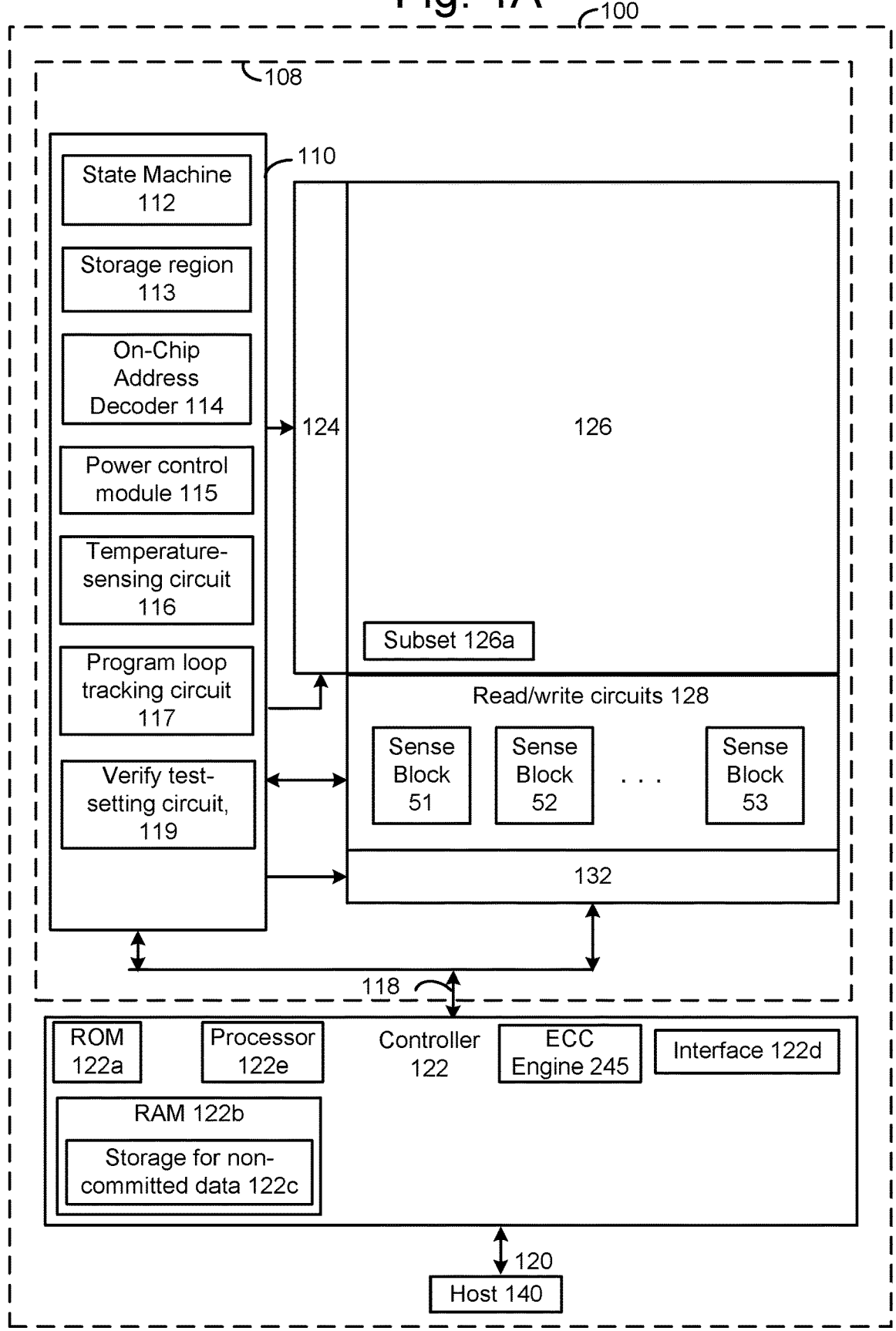
FIG. 1A is a block diagram of an example storage device.

FIG. 1A is a block diagram of an example storage device. The storage device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same storage device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, a program loop tracking circuit 117, and a verify test-setting circuit 119. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program operation. The program loop tracking circuit 117 can track the current program loop number, which corresponds to the magnitude of Vpgm when incremental step pulse programming. The verify test-setting circuit 119 can set lockout conditions during verify tests in a program operation, such as by setting a word line verify voltage, a bit line voltage and/or a sense time. The verify test-setting circuit 119 can be responsive to a temperature from the temperature-sensing circuit 116 and/or the current program loop number from the program loop tracking circuit 117, for example.

Figure 1B:
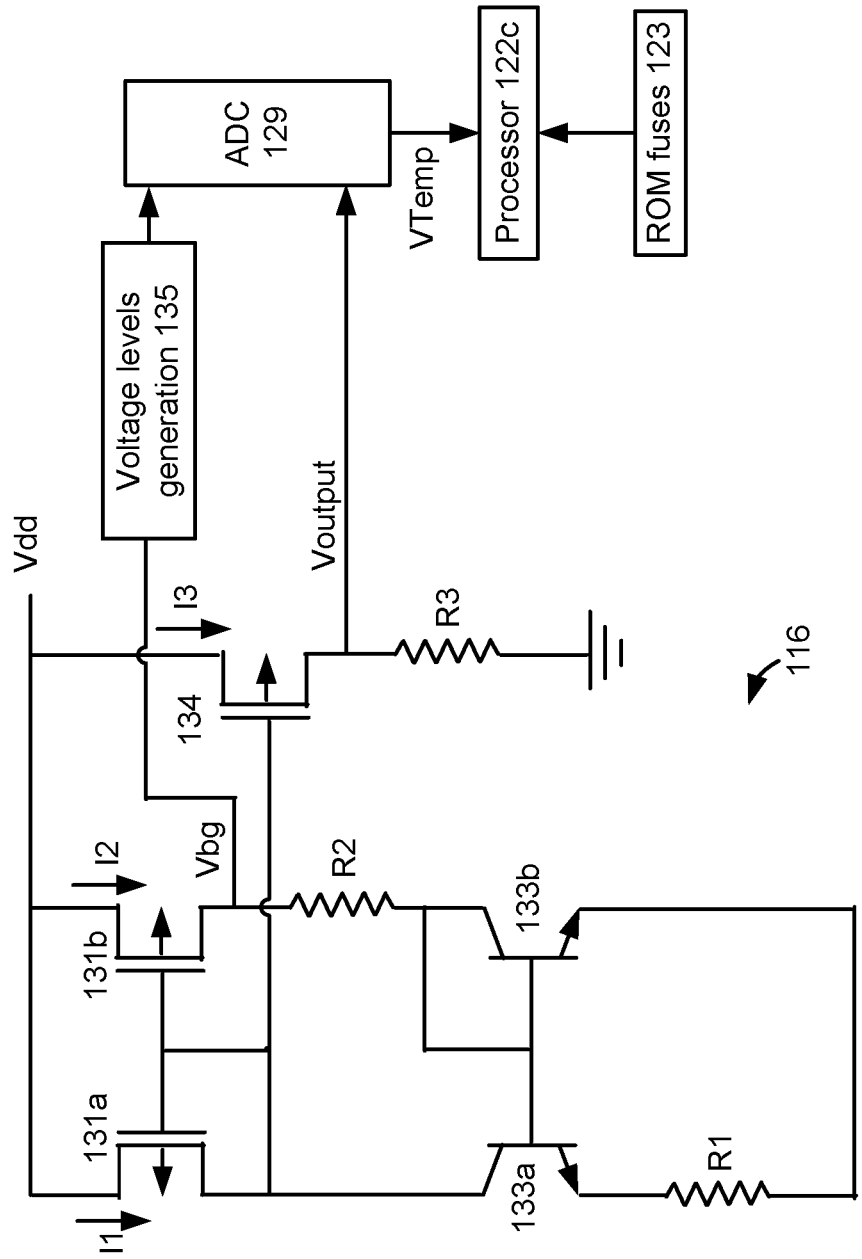
FIG. 1B depicts an example of the temperature-sensing circuit 116 of FIG. 1A.

See FIG. 1B for an example implementation of the temperature-sensing circuit. The temperature-sensing circuit, program loop tracking circuit and verify test-setting circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, program loop tracking circuit 117, verify test-setting circuit 119, sense blocks 51, 52, . . . , 53, read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a of the memory structure for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid-state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The temperature can be used to set a temperature-based lockout condition in the memory device, for example.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
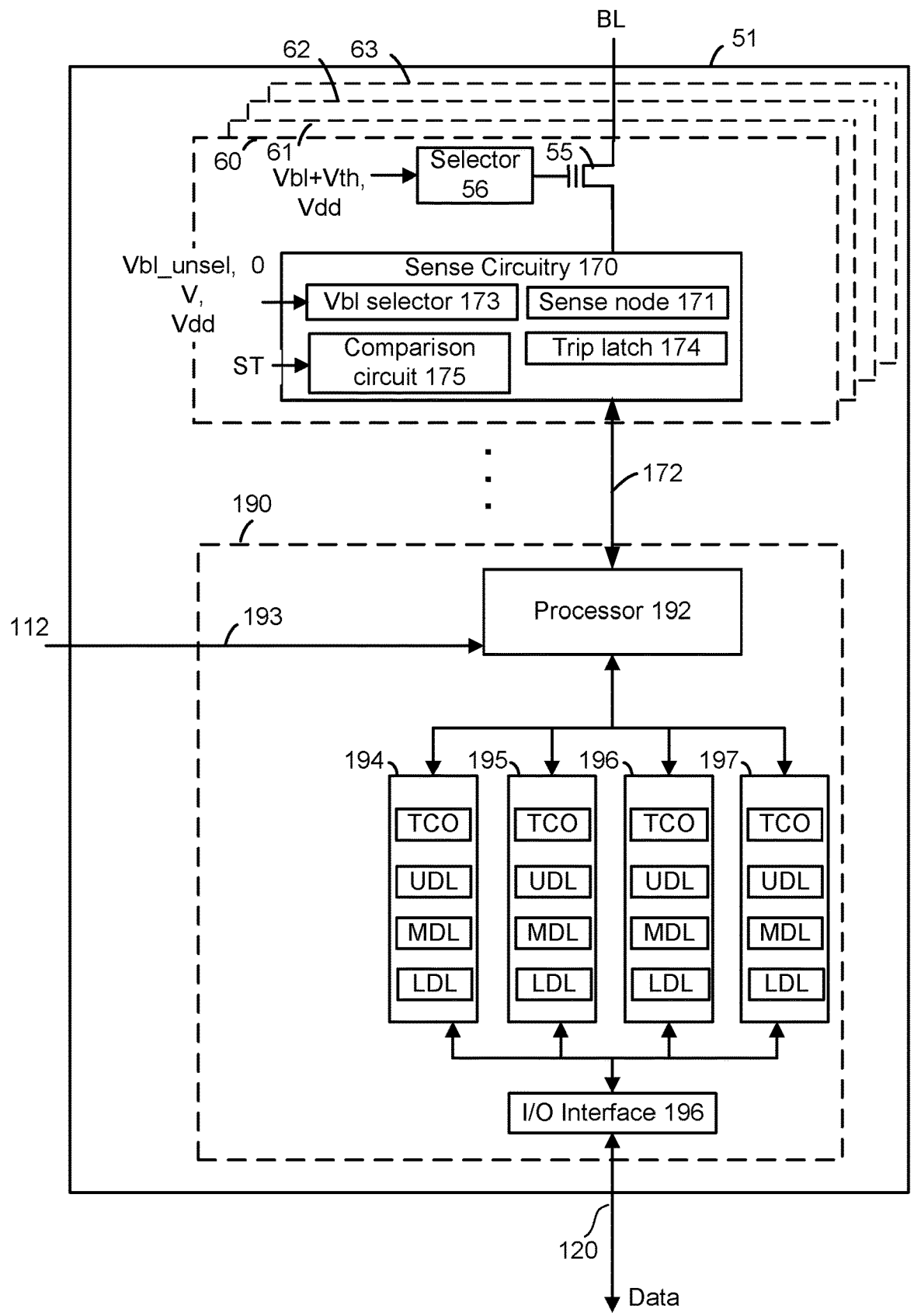
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_unsel (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vb1+Vth is passed by the selector 56, the bit line voltage will be Vbl. This assumes the source line is at 0 V. The bit line voltage can be adjusted to adjust a verify test as discussed herein. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. See also FIG. 11A. The comparison circuit 175 is used to compare the sense node voltage to a trip voltage at a sense time ST. The sense time can be adjusted to adjust a verify test as discussed herein. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of four data latches, e.g., comprising individual latches LDL, MDL, UDL and TCO, can be provided for each sense circuit. In some cases, a different number of data latches may be used. In a three bit per cell embodiment, LDL stores a bit for a lower page of data, MDL stores a bit for a middle page of data and UDL stores a bit for an upper page of data. TCO can be used to store a bit indicating whether an associated memory cell has been classified as a high or low Tco memory cell, in some cases. Generally, a number N>=1 of TCO latches can be used for each NAND string to store data indicating a Tco classification of a corresponding memory cell connected to a selected word line. The TCO latches associated with a NAND string can be used to store N bits indicating one of 2^N classifications of Tco.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
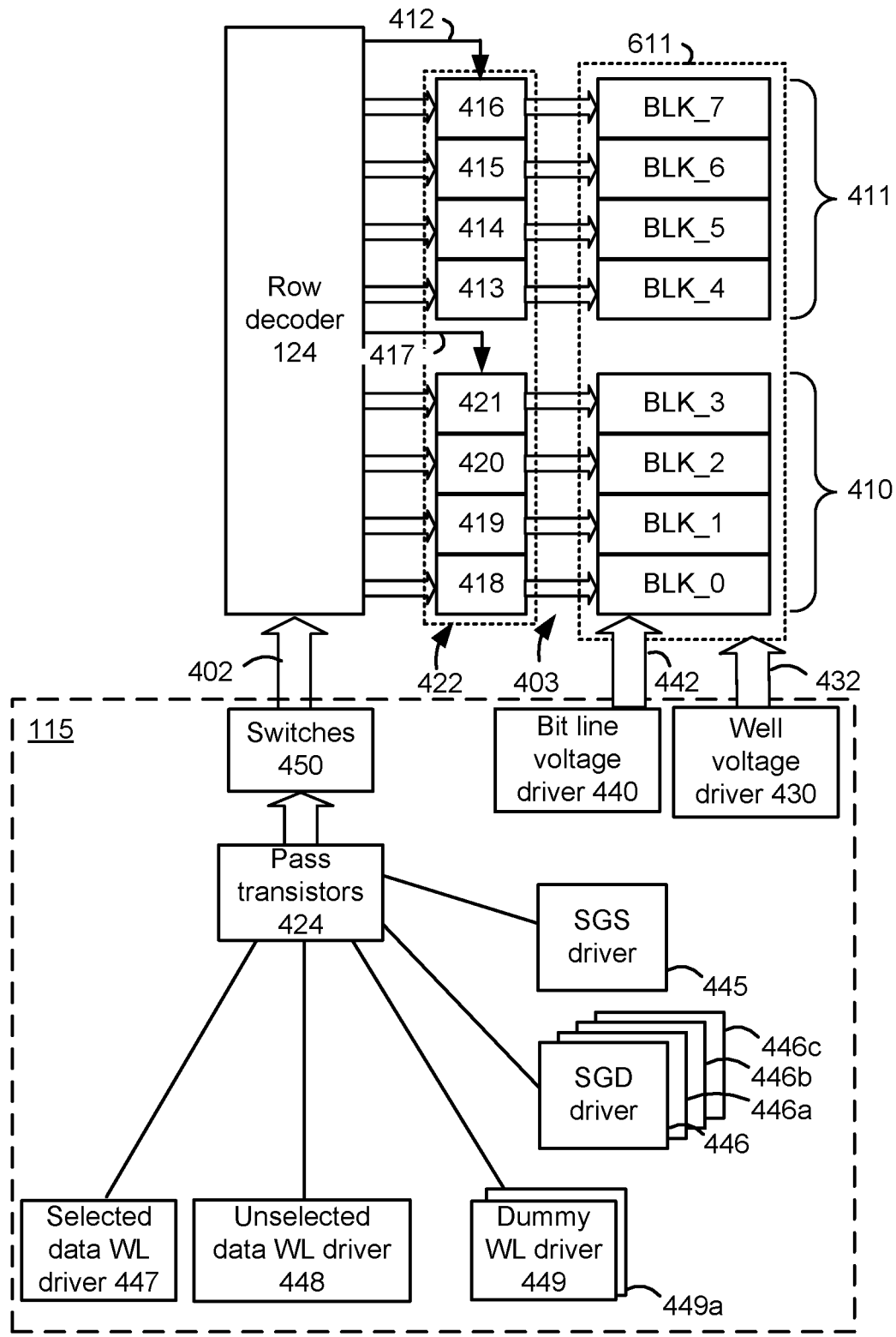
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. Driver 448 can be used to apply a voltage to unselected data word lines, and dummy word line drivers 449 and 449a can be used to provide voltages on dummy word lines WLDD and WLDS, respectively, in FIG. 6A.

The voltage drivers can also include separate SGD drivers for each sub-block. For example, SGD drivers 446, 446a, 446b and 446c can be provided for SB0, SB1, SB2 and SB3, respectively, such as in FIG. 7. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a voltage Vsl to the well region 611b (FIG. 6A) in the substrate, via control lines 432. The well voltage driver 430 is one example of a source line driver, where the well region 611b is a source line, e.g., a conductive path connected to the source ends of the NAND strings. In one approach, the well region 611a is common to the blocks. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
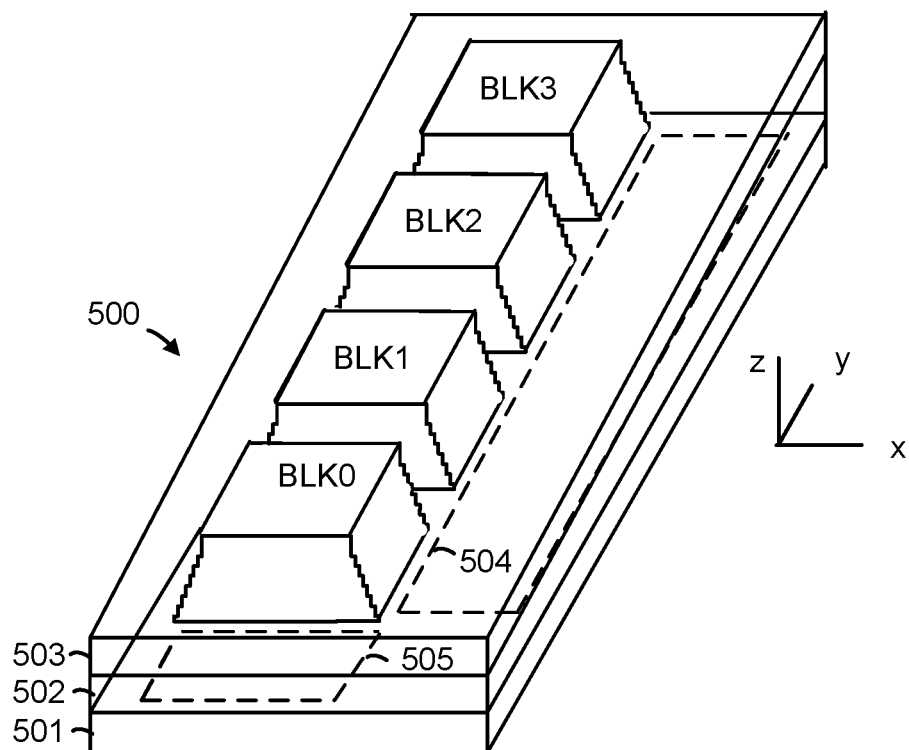
FIG. 4 is a perspective view of a memory device 500 comprising a set of blocks in an example 3D configuration of the memory structure 126 of FIG. 1A.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
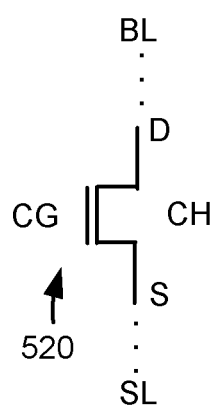
FIG. 5 depicts an example transistor 520.
Figure 6A:
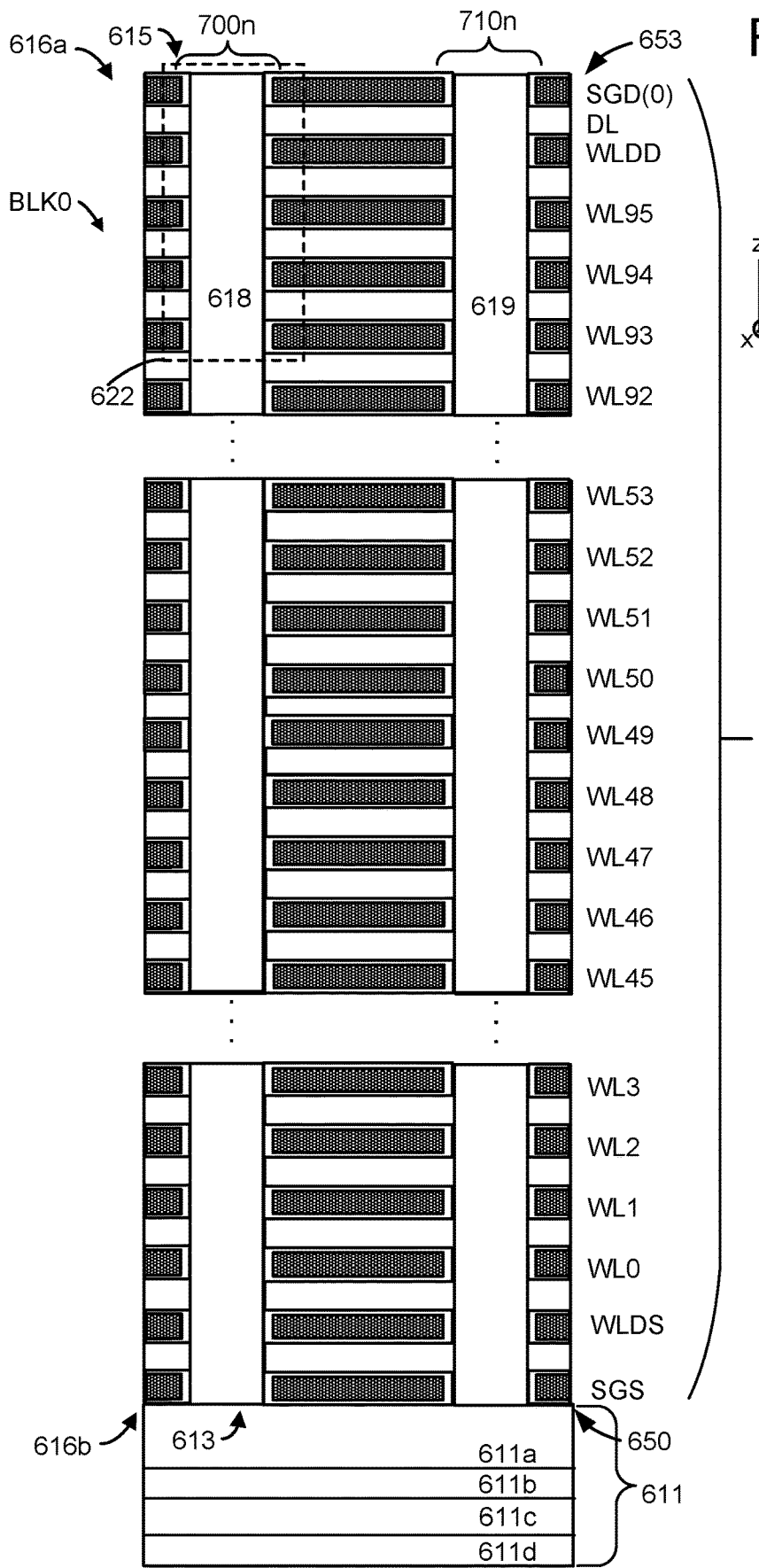
FIG. 6A depicts an example cross-sectional view of a portion of BLK0 of FIG. 4, including NAND strings 700n and 710n.

FIG. 5 depicts an example transistor 520. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string FIG. 6A depicts an example cross-sectional view of a portion of BLK0 of FIG. 4, including NAND strings 700n and 710n. In this example, the NAND strings 700n and 710n are in different sub-blocks. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 611a is an n-type source diffusion layer or well in the substrate. The well region is in contact with a source end of each string of memory cells in a block. The n-type well region 611a in turn is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach, and form a source line SL which provides a voltage to a source end of each NAND string in a block.

The NAND string 700n has a source end 613 at a bottom 616b of the stack 610 and a drain end 615 at a top 616a of the stack. Metal-filled slits may be provided periodically across the stack as local interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
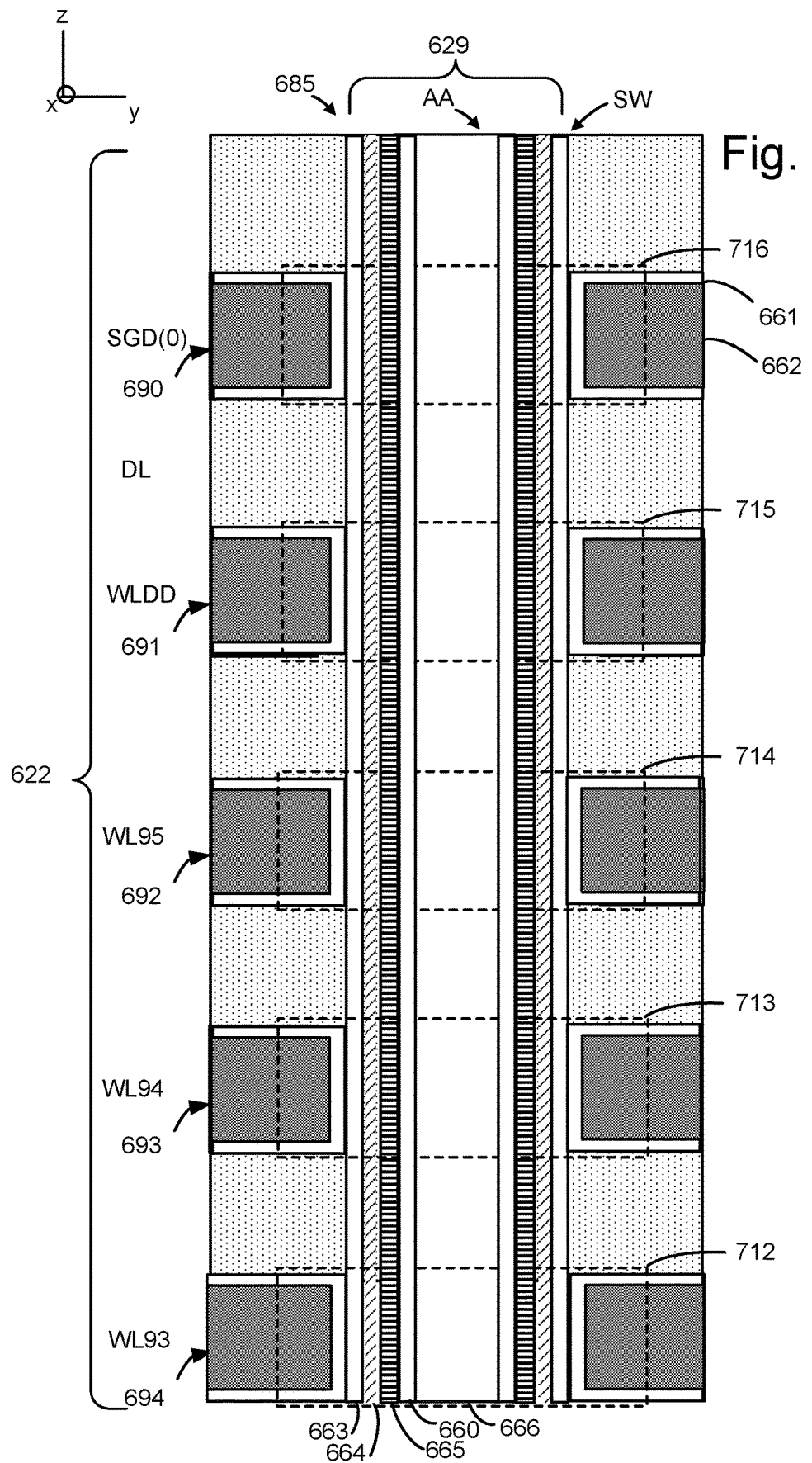
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), and a channel 660 (e.g., comprising polysilicon). A dielectric 666 (e.g., comprising silicon dioxide) may fill a central core of each memory hole. A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Figure 6C:
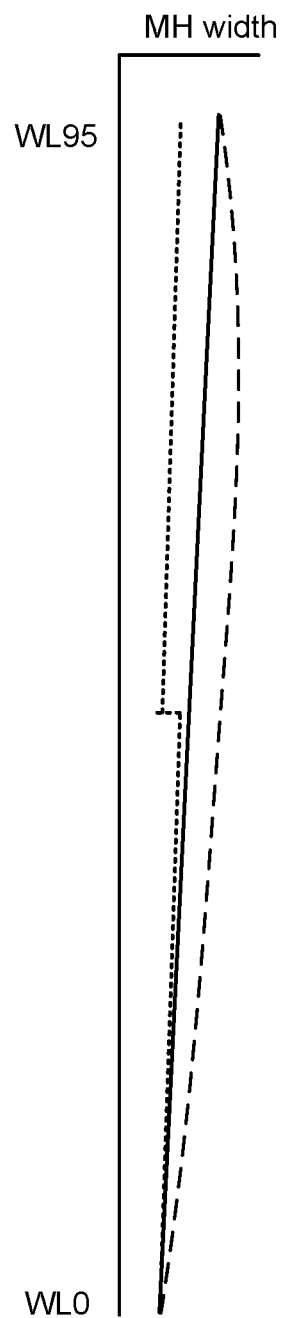
FIG. 6C depicts a plot of memory hole width along the memory hole 618 in FIG. 6A.

FIG. 6C depicts a plot of memory hole width along the memory hole 618 in FIG. 6A. The vertical axis is aligned with the stack of FIG. 6A and depicts a width (MH width), e.g., diameter, of the pillars formed by materials in the memory hole 618. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 6C). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 6C).

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes. A narrower memory hole correlates with a faster program speed and a higher Tco and a wider memory hole correlates with a lower program speed and a lower Tco. See FIG. 9A.

Figure 6D:
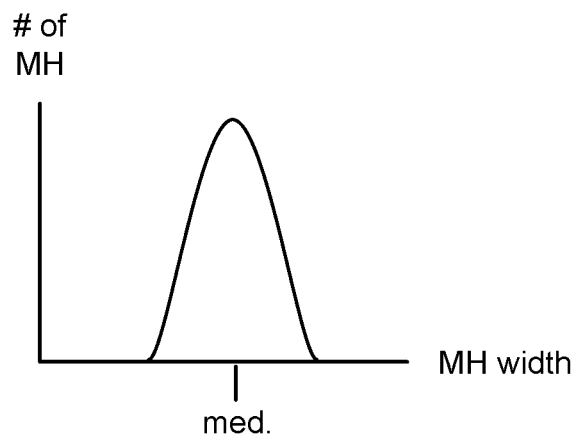
FIG. 6D depicts a plot of a number of memory holes versus a memory hole width at a given height in a stack.

FIG. 6D depicts a plot of a number of memory holes versus a memory hole width at a given height in a stack. Due to variations in the fabrication process, MH width varies even at a fixed height in the stack, e.g., along a given word line. MH width may have a normal distribution with a median value (med.). These variations can result in Tco and program speed variations among the memory cells connected to a word line. Tco and program speed variations can also be caused by other factors such as a varying thickness of the annular layers in the memory holes.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 8A:
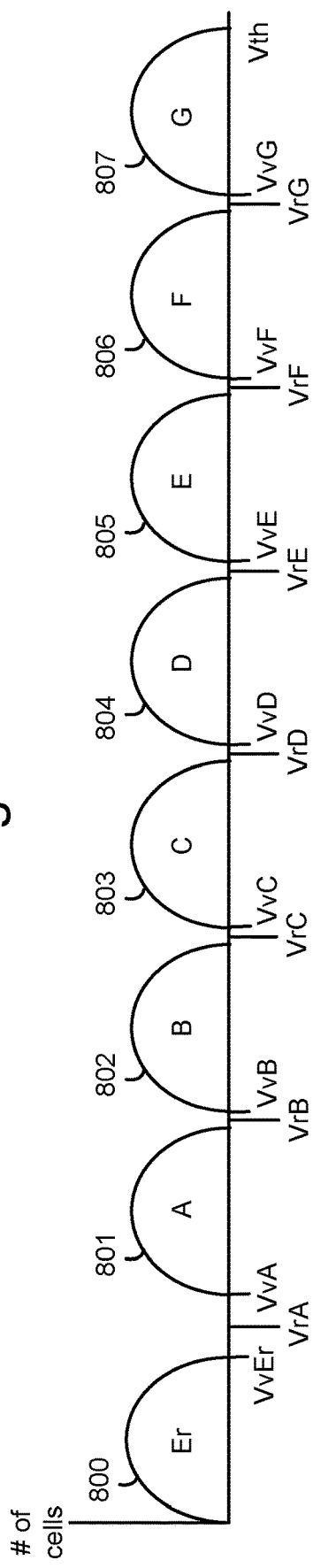
FIG. 8A depicts example Vth distributions of a set of memory cells with three bits per cell and eight data states.

FIG. 8A depicts example Vth distributions of a set of memory cells with three bits per cell and eight data states. The vertical axis depicts a number of memory cells on a logarithmic scale, and the horizontal axis depicts a Vth of the memory cells on a linear scale. In one approach, at a start of a program operation, the memory cells are all initially in the erased (Er) state, as represented by the Vth distribution 800. After the program operation is successfully completed, the memory cells assigned to the A-G states are represented by the Vth distributions 801-807, respectively. The verify voltages VvA-VvG are used in the program-verify tests of the memory cells. Read voltages VrA-VrG can be used for reading the states of the memory cells in a read operation. The verify voltages and read voltages are examples of program parameters for three-bit per cell operations.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight state example. The number of data states could be higher or low than eight data states.

Figure 8B:
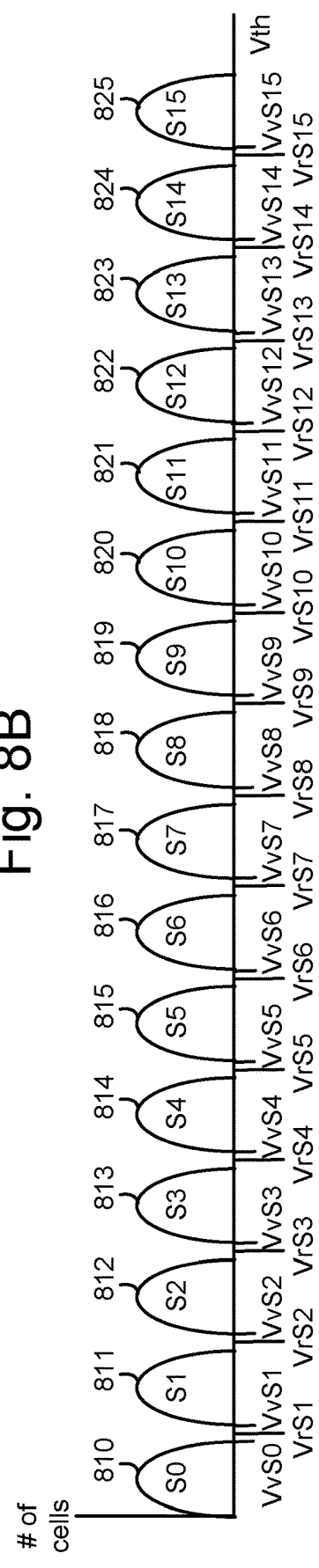
FIG. 8B depicts example Vth distributions of a set of memory cells with four bits per cell and sixteen data states.

FIG. 8B depicts example Vth distributions of a set of memory cells with four bits per cell and sixteen data states. The Vth distribution 810 is for the erased state S0 and the Vth distributions 811-825 are for the programmed data states S1-S15, respectively, which have corresponding verify voltages VvS1-VvS15, respectively. The erased state has an erase-verify voltage VvS0. Read voltages VrS1-VrS15 are also depicted.

As discussed below, the Vth distributions can shift and widen due to a temperature change between the time of programming and the time of a subsequent read operation.

Figure 8C:
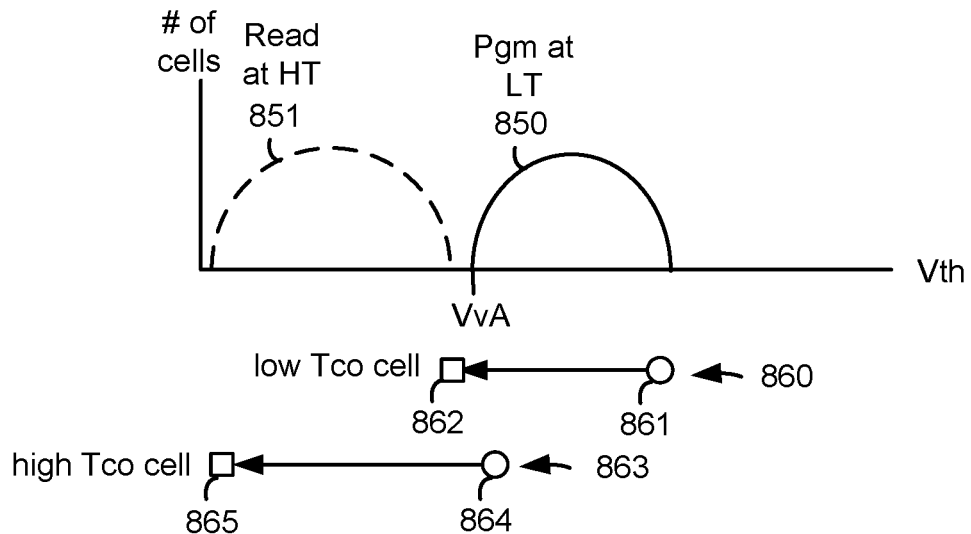
FIG. 8C depicts example threshold voltage distributions for memory cells assigned to a data state, where the memory cells are programmed at a low temperature and read at a high temperature, and where a countermeasure to Vth widening is not used.

FIG. 8C depicts example threshold voltage distributions for memory cells assigned to a data state, where the memory cells are programmed at a low temperature and read at a high temperature, and where a countermeasure to Vth widening is not used. The A state is used as an example, but a similar shift and widening of the Vth distribution occurs for other states. The Vth distribution 850 is obtained after programming the memory cells assigned to the A state at a low temperature, and the Vth distribution 851 is obtained when reading these memory cells at a high temperature. The increase in temperature causes a downshift and widening of the Vth distribution.

A memory device may be rated to operate in a temperature range such as −30 C to 85 C. A low temperature could be a temperature below a lower temperature threshold such as 25 C, while a high temperature could be temperature above an upper temperature threshold such as 40 C, in one possible approach.

The Vth distributions are made up of memory cells with different Tco values. For example, for a low Tco memory cell, the diagram 860 shows that a Vth (denoted by a circle 861) at the upper tail of the Vth distribution 850 will downshift to a Vth (denoted by a square 862) at the upper tail of the Vth distribution 851. For a high Tco memory cell, the diagram 863 shows that a Vth (denoted by a circle 864) at the lower tail of the Vth distribution 850 will downshift to a Vth (denoted by a square 865) at the lower tail of the Vth distribution 851. As a result of the different Tco values, the width of the Vth distribution increases as the temperature changes.

Figure 8D:
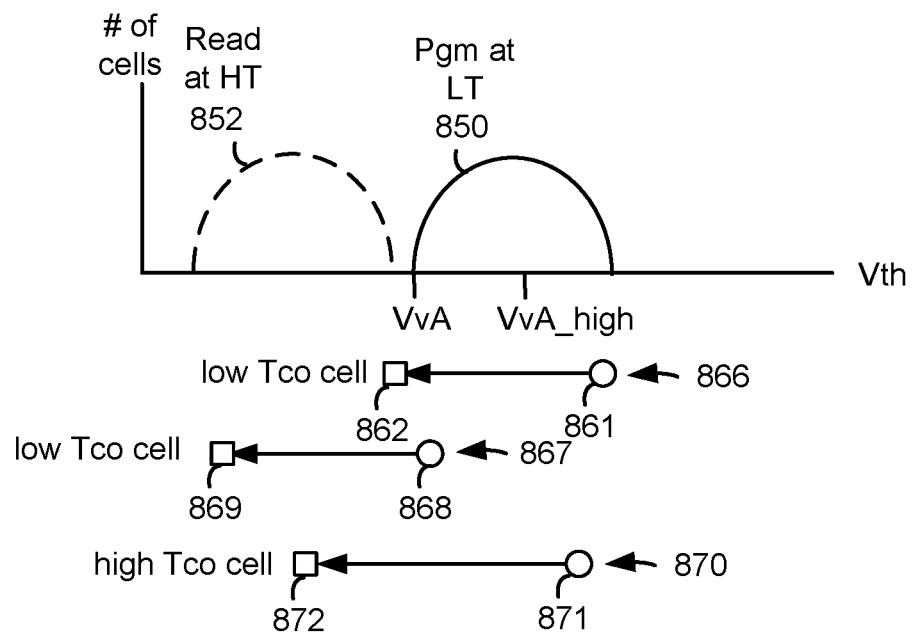
FIG. 8D depicts a modification to the example threshold voltage distributions in FIG. 8C when a countermeasure to Vth widening is used.

FIG. 8D depicts a modification to the example threshold voltage distributions in FIG. 8C when a countermeasure to Vth widening is used. The countermeasure uses the techniques described herein to change the verify tests according to the temperature and the memory cell Tco. In this case, the high Tco memory cells are subject to a higher verify voltage of VvA_high>VvA so that the Vth of the high Tco memory cells will tend to be at the upper tail of the Vth distribution 850. When the memory cells are read at the high temperature, the Vth of the high Tco memory cells will tend to be mid-range in the Vth distribution 852.

For example, for a low Tco memory cell, the diagram 866 shows that a Vth (denoted by the circle 861) at the upper tail of the Vth distribution 850 will downshift to a Vth (denoted by the square 862) at the upper tail of the Vth distribution 851, as in FIG. 8C. Also, for a low Tco memory cell, the diagram 867 shows that a Vth (denoted by the circle 868) at the lower tail of the Vth distribution 850 will downshift to a Vth (denoted by the square 869) at the lower tail of the Vth distribution 852. For a high Tco memory cell, the diagram 870 shows that a Vth (denoted by a circle 871) at the upper half of the Vth distribution 850 will downshift to a Vth (denoted by a square 872) which is mid-range in the Vth distribution 852. Since the lower tail of the Vth distribution 852 is defined by the low Tco memory cells instead of the high Tco memory cells, the width of the Vth distribution 852 is less than the width of the Vth distribution 851.

Figure 8E:
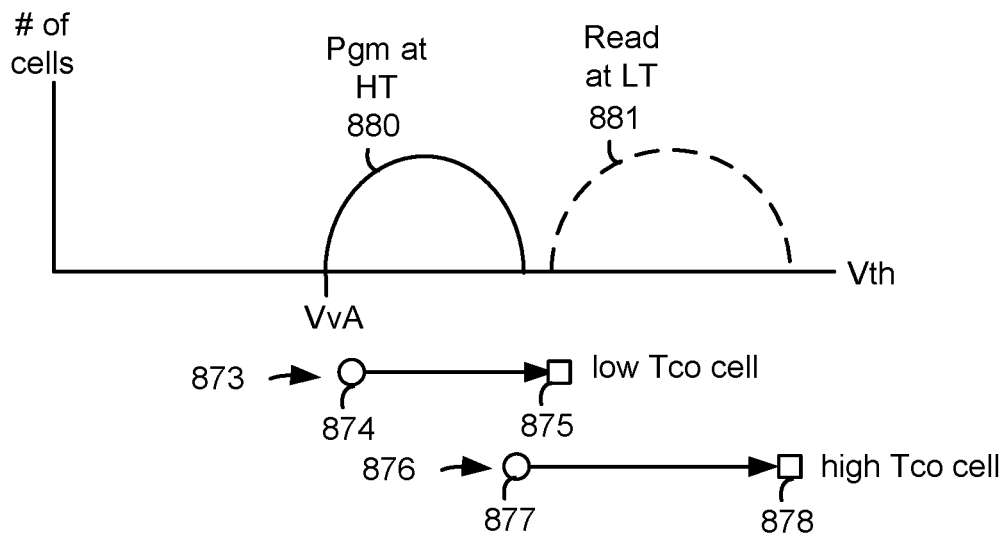
FIG. 8E depicts example threshold voltage distributions for memory cells assigned to a data state, where the memory cells are programmed at a high temperature and read at a low temperature, and where a countermeasure to Vth widening is not used.

FIG. 8E depicts example threshold voltage distributions for memory cells assigned to a data state, where the memory cells are programmed at a high temperature and read at a low temperature, and where a countermeasure to Vth widening is not used. The Vth distribution 880 is obtained after programming the memory cells assigned to the A state at a high temperature, and the Vth distribution 881 is obtained when reading these memory cells at a low temperature. The decrease in temperature causes an upshift and widening of the Vth distribution.

For a low Tco memory cell, the diagram 873 shows that a Vth (denoted by a circle 874) at the lower tail of the Vth distribution 880 will upshift to a Vth (denoted by a square 875) at the lower tail of the Vth distribution 881. For a high Tco memory cell, the diagram 876 shows that a Vth (denoted by a circle 877) at the upper tail of the Vth distribution 880 will upshift to a Vth (denoted by a square 878) at the upper tail of the Vth distribution 881. As a result of the different Tco values, the width of the Vth distribution increases as the temperature changes.

Figure 8F:
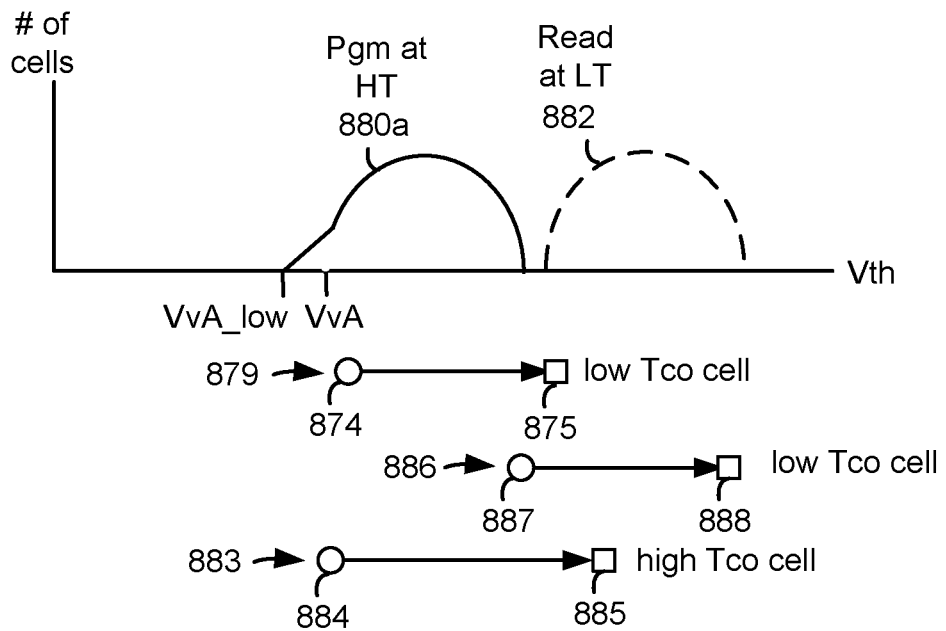
FIG. 8F depicts a modification to the example threshold voltage distributions in FIG. 8E when a countermeasure to Vth widening is used.

FIG. 8F depicts a modification to the example threshold voltage distributions in FIG. 8E when a countermeasure to Vth widening is used. In this case, the high Tco memory cells are subject to a lower verify voltage of VvA_low<VvA so that the Vth of the high Tco memory cells will tend to be at the lower tail of the Vth distribution 880a. When the memory cells are read at the low temperature, the Vth of the high Tco memory cells will tend to be at the lower tail or mid-range in the Vth distribution 882.

For example, for a low Tco memory cell, the diagram 879 shows that a Vth (denoted by the circle 874) at the lower tail of the Vth distribution 880a will upshift to a Vth (denoted by the square 875) at the lower tail of the Vth distribution 882. Also, for a low Tco memory cell, the diagram 886 shows that a Vth (denoted by the circle 887) at the upper tail of the Vth distribution 880a will upshift to a Vth (denoted by the square 888) at the upper tail of the Vth distribution 882. For a high Tco memory cell, the diagram 883 shows that a Vth (denoted by a circle 884) at the lower tail of the Vth distribution 880a will upshift to a Vth (denoted by a square 885) which is at the lower tail or mid-range in the Vth distribution 882. Since the upper tail of the Vth distribution 882 is defined by the low Tco memory cells instead of the high Tco memory cells, the width of the Vth distribution 882 is less than the width of the Vth distribution 881.

In this process, the lower tail of the Vth distribution 880a may be extended slightly but this is compensated for by the narrowing of the Vth distribution during a subsequent read process at a low temperature.

The horizontal axes have the same scale in FIG. 8C-8F.

Figure 9A:
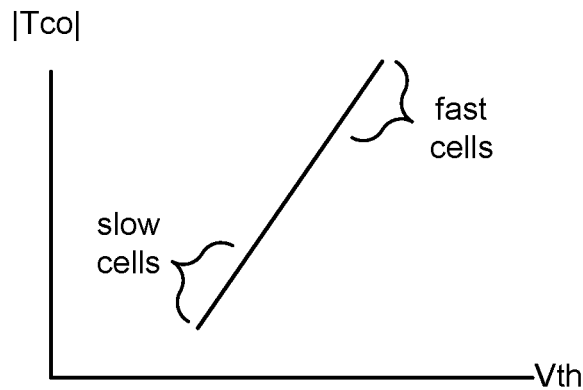
FIG. 9A depicts a plot of temperature coefficient (Tco) versus threshold voltage, showing how fast-programming memory cells have a higher Tco than slow-programming memory cells.

FIG. 9A depicts a plot of temperature coefficient (Tco) versus threshold voltage, showing how fast-programming memory cells have a higher Tco than slow-programming memory cells. As mentioned, variations in the memory hole width, and other factors, can lead to variations in Tco and programming speed. The Vth may represent a value which is achieved after one or more program pulses are applied to a set of memory cells connected to a selected word line.

Figure 9B:
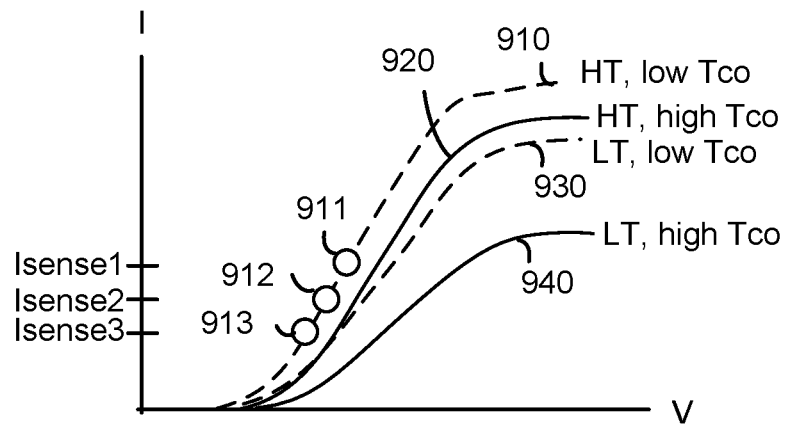
FIG. 9B depicts a plot of current (I) versus control gate voltage (V) for memory cells with high and low Tco, at high and low temperatures.

FIG. 9B depicts a plot of current (I) versus control gate voltage (V) for memory cells with high and low Tco, at high and low temperatures. Plots 910 and 920 denote the I-V characteristic at a high temperature for a low or high Tco memory cell, respectively, and the plots 930 and 940 denote the I-V characteristic at a low temperature for a low or high Tco memory cell, respectively. The slope of the plots is the inverse of the subthreshold slope and is a measure of how efficiently a memory cell can pass current as a function of its control gate voltage. Generally, a lower subthreshold slope is preferable. For example, a subthreshold slope of 100 mV/dec is better than 300 mV/dec, in terms of a memory cell (transistor) performance, where the performance is measured by switching speed and drive current. Overall, it is better if there is a larger change in current in response to a smaller change in voltage.

Different points on the plot corresponds to different values of current. For example, the points represented by circles 911, 912 and 913 correspond to Isense1, Isense2 and Isense3, respectively. Example processes for measuring the subthreshold slope are discussed further below.

Figure 9C:
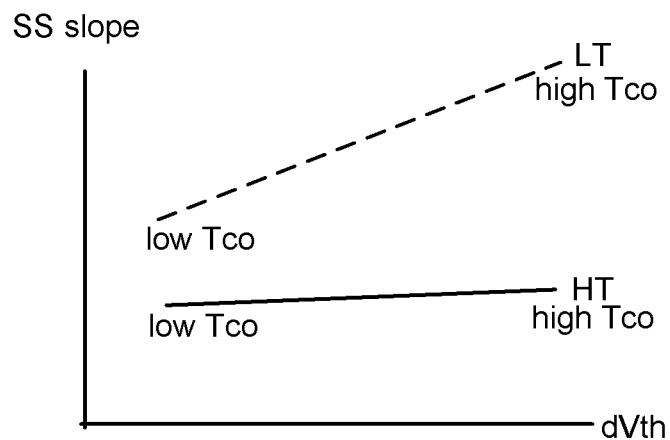
FIG. 9C depicts a plot of subthreshold slope versus a change in threshold voltage between the time of programming and the time of reading, for memory cells with high and low Tco, at high and low temperatures, consistent with FIG. 9B.

FIG. 9C depicts a plot of subthreshold slope (SS slope) versus a change in threshold voltage (dVth) between the time of programming and the time of reading, for memory cells with high and low Tco, at high and low temperatures, consistent with FIG. 9B. At low temperature, the dashed line shows that the subthreshold slope is significantly higher for a high Tco memory cell than for a low Tco memory cell. At high temperature, the solid line shows that the subthreshold slope is somewhat higher for a high Tco memory cell than for a low Tco memory cell. Generally, a set of memory cells will have a range of Tco values, between low and high.

Figure 10B:
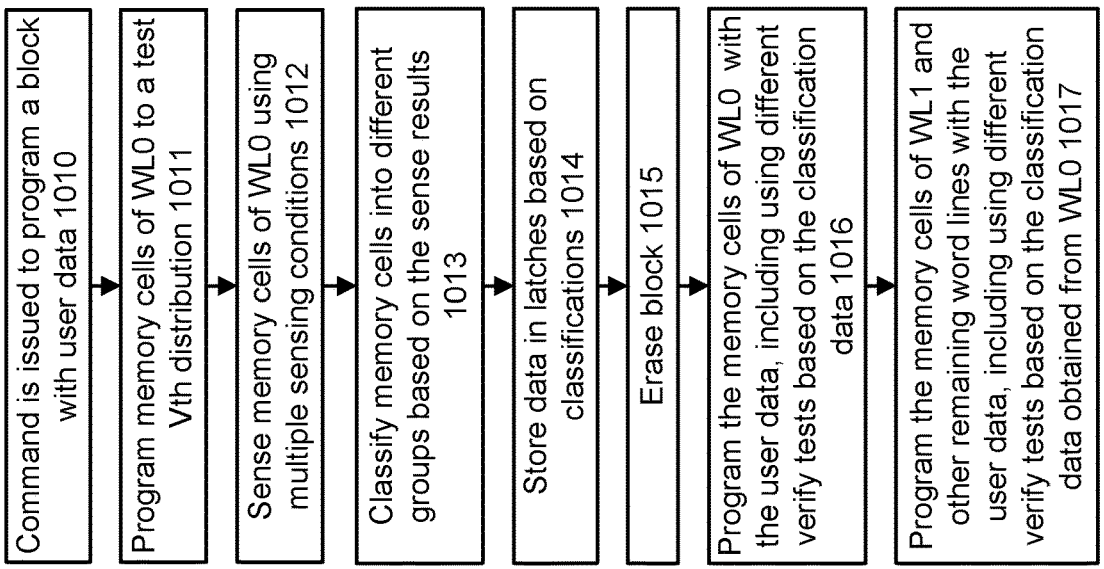
FIG. 10B depicts a flowchart of a first example process for programming memory cells, consistent with steps 1003-1006 of FIG. 10A.
Figure 10A:
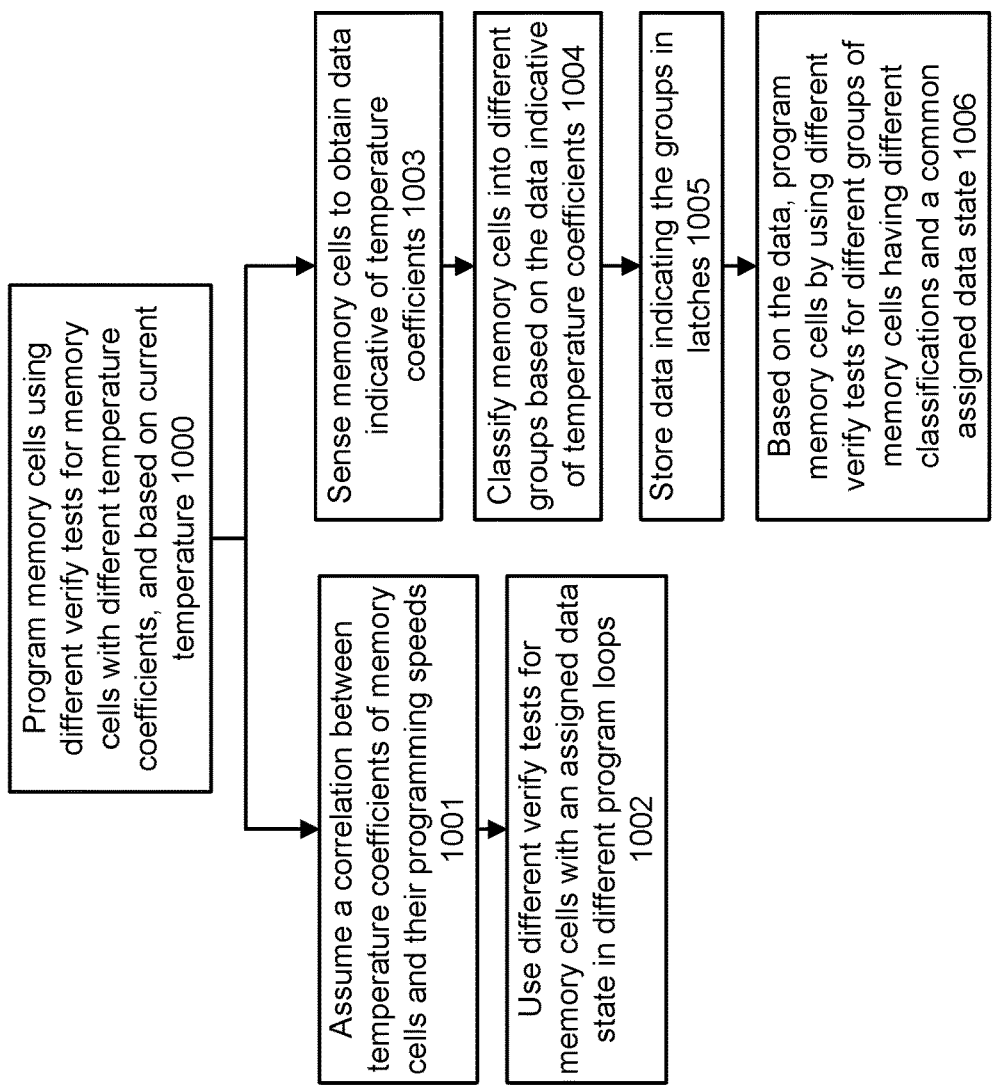
FIG. 10A depicts a flowchart of an example process for programming memory cells using different verify tests for memory cells with different temperature coefficients, and based on a current temperature.

FIG. 10A depicts a flowchart of an example process for programming memory cells using different verify tests for memory cells with different temperature coefficients, and based on a current temperature (step 1000). In one option, step 1001 includes assuming a correlation between the temperature coefficients of the memory cells and their programming speeds, such as depicted in FIG. 9A. Step 1002 includes using different verify tests for the memory cells with an assigned data state in different program loops, such as depicted in FIG. 15A-17B. The different verify tests use different lockout conditions. A lockout condition refers to a condition which a memory cell must satisfy in order to be locked out from further programming. The condition is defined by parameters of a verify test and can include, e.g., a word line verify voltage, a sense time and/or a bit line voltage during sensing. A particular Vth is associated with a lockout condition such that a memory cell is locked out from further programming when its Vth, as sensed using the parameters of the verify test, exceeds the particular Vth. A memory cell is locked out from further programming when it is sensed as being in a non-conductive state during the verify test.

In another option, step 1003 includes sensing the memory cells to obtain data indicative of their temperature coefficients. This can be done for each individual memory cell connected to a word line, for example. Step 1004 includes classifying the memory cells into different groups (one group per memory cell) based on the data indicative of the temperature coefficients. Step 1005 includes storing data indicating the groups in the latches (such as the TCO latches in FIG. 2). For example, a 0 or 1 bit can indicate the first or second group, respectively. Step 1006 includes, based on the data, programming memory cells by using different verify tests for different groups of memory cells having different classifications and a common assigned data state. The different verify tests can be similar to those discussed in connection with step 1002.

The process of steps 1003-1006 allows for optimizing (narrowing down) of Vth distributions based on individual cell thermal properties for various temperatures. The process identifies thermally fast (high Tco) and slow (low Tco) memory cells. Based on the thermal properties of individual memory cells, the verify tests can be adjusted based on the current temperature. The verify tests can be adjusted by adjusting a word line verify voltage or parameters of the sense circuit such as Vbl and sense time. The trip voltage in the sense circuit could also be adjusted. Increasing the word line verify voltage, Vbl, the sense time and/or the trip voltage results in programming a memory cell to a higher Vth, which is desirable for a high Tco memory cell when the temperature is low, e.g., below 25 C (see FIGS. 8C and 8D). Decreasing the word line verify voltage, Vbl, the sense time and/or the trip voltage results in programming a memory cell to a lower Vth, which is desirable for a high Tco memory cell when the temperature is high, e.g., above 40 C (see FIGS. 8E and 8F). The word line verify voltage, Vbl, the sense time and/or the trip voltage can be set to an intermediate, nominal level when the temperature is at an intermediate level, such as from 25-40 C.

FIG. 10B depicts a flowchart of a first example process for programming memory cells, consistent with steps 1003-1006 of FIG. 10A. The process involves programming the memory cells to a test Vth distribution, sensing the memory cells using multiple sensing conditions, and classifying the memory cells based on the sensing results. See also FIGS. 12A and 12B. The classifications provide an indication of the subthreshold slope, which corresponds to Tco. Subsequently, the memory cells can be erased and programmed with user data according to the classification. In one approach, the classification is made for each memory cell of a first-programmed word line (e.g., WL0) of a block, and the classification is carried over to other memory cells on other word lines in the block. For example, the classification of a WL0 memory cell in a NAND string into a low Tco group can be carried over to other memory cells in the same NAND string. A NAND string can be classified as a low Tco NAND string in this case, for example.

This approach avoids the overhead costs of classifying the memory cells of each word line. The Tco is correlated for different cells within a NAND string because the memory hole width of the NAND string, or other properties such as annular layer thickness, are typically correlated along the length of the NAND string. For example, if the memory hole is wider than normal at the elevation of WL0, it is likely to be wider than normal at the elevations of other word lines in the stack. A wider memory hole width correlates with a slower program speed and a lower Tco.

At step 1010, a command is issued to program a block with user data. The memory cells of the block may be in an erased state at this time. The program command can involve memory cells of one or more word lines. Step 1011 includes programming the memory cells of WL0 to a test Vth distribution 1201 such as in FIG. 12A. The test Vth distribution may or may not correspond to an assigned data state. Step 1012 includes sensing the memory cells of WL0 using multiple sensing conditions (e.g., bit line voltages and/or sense times). See FIG. 10E. Step 1013 includes classifying the memory cells into different groups based on the sense results. Each group represents memory cells with a similar subthreshold slope and Tco. Step 1014 includes storing data in latches, such as the TCO latches, based on the classifications. The data can identify the groups.

Step 1015 include erasing the block. The classification data is maintained in the latches at this time. Alternatively, the classification data can be maintained in another location such as at the controller 122. Step 1016 includes programming the memory cells of WL0 with the user data, including using different verify tests based on the classification data. A respective verify test can be used for each memory cell based on the respective classification data in its latches. In one approach, after WL0 has been programmed, step 1017 includes programming the memory cells of WL1 and other remaining word lines with the user data, including using different verify tests based on the classification data obtained from WL0. In some approaches, a back and forth, multi-pass word line programming order is used in which WL0 is partly programmed, then WL1 is partly programmed, then programming of WL0 is completed and so forth.

For example, in FIG. 7, the memory cells 703, 723, 743 and 763 of WL0 may be sensed to obtain the classification data. The classification data of the memory cell 703 will be used to set the verify test for the memory cells 703-714, in one approach. Similarly, the classification data of the memory cells 723, 743 and 763 will be used to set the verify test for the memory cells 723-734, 743-754 and 763-774, respectively, in one approach.

Figure 10E:
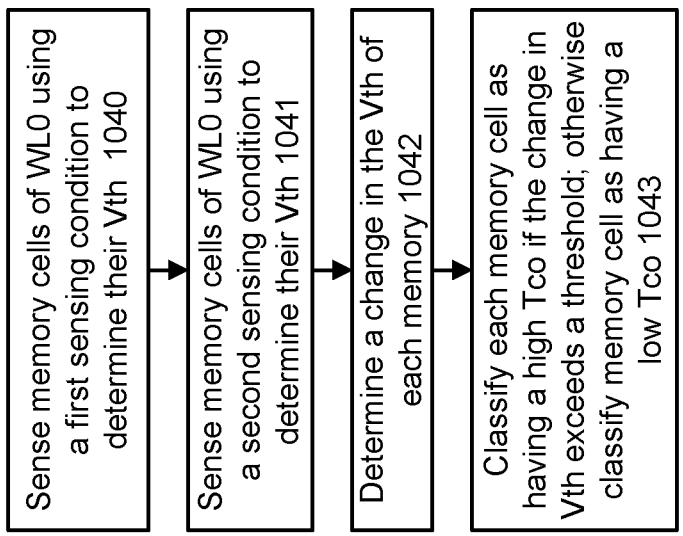
FIG. 10E depicts a flowchart of an example process for sensing memory cells using multiple sensing conditions and classifying the memory cells based on a change on the Vth, consistent with step 1012 of FIG. 10B, step 1021 of FIG. 10C and step 1032 of FIG. 10D.
Figure 10D:
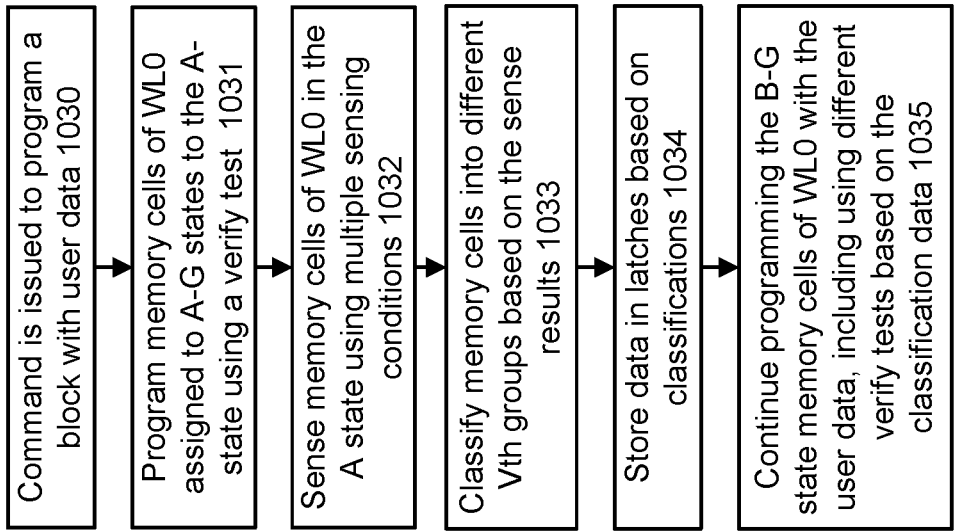
FIG. 10D depicts a flowchart of a third example process for programming memory cells, consistent with steps 1003-1006 of FIG. 10A.
Figure 10C:
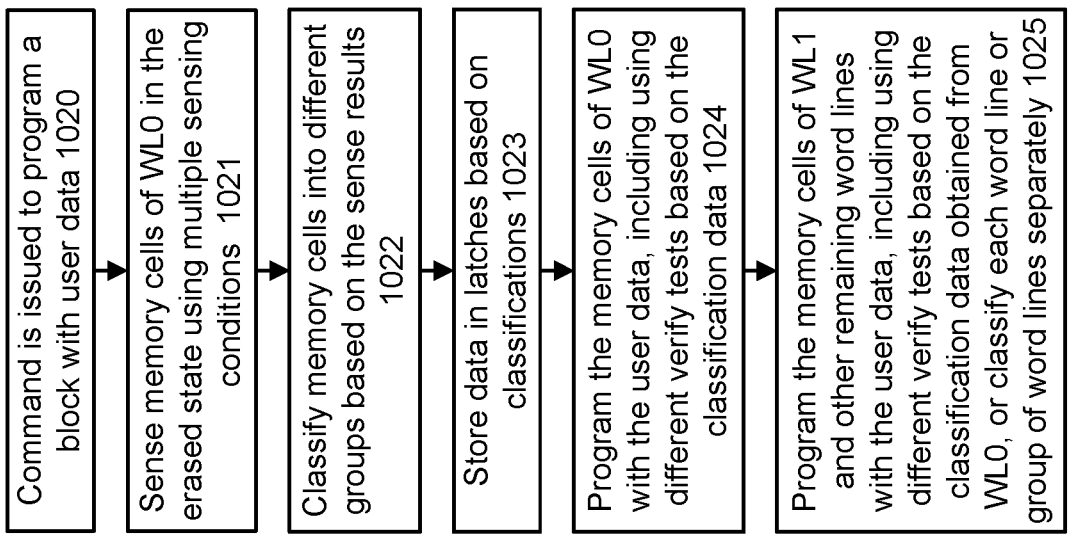
FIG. 10C depicts a flowchart of a second example process for programming memory cells, consistent with steps 1003-1006 of FIG. 10A.

FIG. 10C depicts a flowchart of a second example process for programming memory cells, consistent with steps 1003-1006 of FIG. 10A. In this approach, the classification is made using memory cells in the erased state. This saves time by avoiding the steps of programming the memory cells to a test Vth distribution and subsequently erasing the memory cells, before the programming of the user data begins, as in FIG. 10B. See also FIG. 12C. Each memory cell connected to a word line can be individually sensed and classified. In one approach, the classification is made for each memory cell of a first-programmed word line (e.g., WL0) of a block, and the classification is carried over to other memory cells on other word lines in the block. In another approach, the classification is made for each memory cell of each programmed word line. This approach provides the most granular classification data but has a higher overhead cost.

In yet another approach, the classification is made for one word line in a group of adjacent word lines which is fewer than all word lines of a block. For example, referring to FIG. 7, in an example with four groups of 24 word lines per group, the classification can be made for memory cells of WL0 and used for programming WL0-23. The classification can then be made for memory cells of WL24 and used for programming WL24-47. The classification can then be made for memory cells of WL48 and used for programming WL48-71. The classification can then be made for memory cells of WL72 and used for programming WL72-95. This approach classifies different groups of memory cells separately to more accurately assess the subthreshold slope, while avoiding the overhead cost of classifying each word line.

At step 1020, a command is issued to program a block with user data. The memory cells of the block may be in an erased state at this time. The program command can involve memory cells of one or more word lines. Step 1021 includes sensing the memory cells of WL0 in the erased state using multiple sensing conditions. Step 1022 includes classifying the memory cells into different groups based on the sense results. Step 1023 includes storing data in latches, such as the TCO latches, based on the classifications.

Step 1024 includes programming the memory cells of WL0 with the user data, including using different verify tests based on the classification data. Step 1025 includes programming the memory cells of WL1 and other remaining word lines with the user data, including using different verify tests based on the classification data obtained from WL0. Or, as mentioned, each word line or group of word lines can be classified separately.

FIG. 10D depicts a flowchart of a third example process for programming memory cells, consistent with steps 1003-1006 of FIG. 10A. In this approach, the classification is made using memory cells in one of the programmed states. The lowest programmed state, the A state, is used in this example. This approach has similar advantages as the approach of FIG. 10C but avoids performing the sensing and classification for the memory cells assigned to the erased state, for which the Vth distribution may have a more variable Vth width and shape than the Vth distribution of a programmed state. Instead, the cells assigned to a programmed state such as the A-G state in a three-bit per cell example, are initially programmed to the A state, at which time the sensing and classifying are performed. The sensing and classifying can be performed on one word line in a block, e.g., WL0, each word line or for one word line in each of multiple groups of adjacent word lines. The results of the classifying can be used to adjust the lockout conditions in the programming of the memory cells assigned to the remaining, higher data states. As a tradeoff, the lockout condition is not adjusted for the memory cells assigned to the A state.

At step 1030, a command is issued to program a block with user data. The memory cells of the block may be in an erased state at this time. The program command can involve memory cells of one or more word lines. Step 1031 includes programming memory cells of WL0 which are assigned to the programmed states, e.g., the A-G states, to the A state using a verify test. See FIGS. 12D and 12E. Step 1032 includes sensing the memory cells of WL0 in the A state using multiple sensing conditions. Step 1033 includes classifying the memory cells into different groups based on the sense results. Step 1034 includes storing data in latches, such as the TCO latches, based on the classifications.

Step 1035 includes continuing the programming of the memory cells of WL0 which are assigned to the B-G states with the user data, including using different verify tests based on the classification data.

One alternative to the process of FIG. 10D is to program the A-G state memory cells to an intermediate Vth distribution which is between the erased state and the A state distributions at step 1031. The sensing and classifying can then be performed at step 1032 for these memory cells. The programming can continue to the A-G states while setting different lockout conditions based on the classification data. This approach has the advantage that some or all of the A state memory cells can be programmed with the benefit of the classification data. Due to the small spacing between the Vth distributions of the erased state and the A state, some A state memory cells may have reached the lockout condition at the time of the classification and therefore may not benefit from the classification data.

In FIGS. 10C and 10D, the classifying of the different memory cells and the programming of the threshold voltages of the different memory cells occur in a single program pass.

In FIG. 10B-10D, for each of the different WL0 memory cells, a control circuit is configured to store data based on the classifying of the memory cell and to subsequently use the data in programming threshold voltages of memory cells connected to another word line (e.g., WL1-WL95) to different positions in a threshold voltage distribution according to the temperature.

FIG. 10E depicts a flowchart of an example process for sensing memory cells using multiple sensing conditions and classifying the memory cells based on a change on the Vth, consistent with step 1012 of FIG. 10B, step 1021 of FIG. 10C and step 1032 of FIG. 10D. Step 1040 includes sensing memory cells of WL0 using a first sensing condition to determine their Vth. This can involve applying different word line voltages such as depicted in the time period represented by the arrow 1110 in FIG. 11B, while sensing the memory cells using, e.g., a first sense time and/or bit line voltage. The Vth can be determined with a specified granularity. A higher number of word line voltages and sensing operations can be used to determine the Vth with a higher granularity, at the cost of using additional time. In the example of FIG. 11B, three word line voltages, Vth1-Vth3, are applied. The result of the sensing indicates that the Vth of each cell is below Vth1, between Vth1 and Vth2, between Vth2 and Vth3 or greater than Vth3. The Vth of each memory cell can therefore be determined to fall within one of four Vth ranges R1-R4.

Step 1041 includes sensing memory cells of WL0 using a second sensing condition to determine their Vth. This can involve applying the different word line voltages such as depicted in the time period represented by the arrow 1111 in FIG. 11B, while sensing the memory cells using, e.g., a second sense time and/or bit line voltage. As with the sensing using the first sensing condition, the result of the sensing indicates that the Vth of each cell is below Vth1, between Vth1 and Vth2, between Vth2 and Vth3 or greater than Vth3. The Vth of each memory cell can therefore be determined to fall within one of the four Vth ranges.

The Vth range of each memory cell will typically be different when sensed using the second sensing condition compared to when using the first sensing condition. For example, if the second sensing condition uses a shorter sense time and/or lower bit line voltage than the first sensing condition, the Vth range of each memory cell will be higher when sensed using the second sensing condition compared to when using the first sensing condition. Step 1042 can therefore be used to determine a change in the Vth of each memory cell based on a change in the Vth range.

Figure 12C:
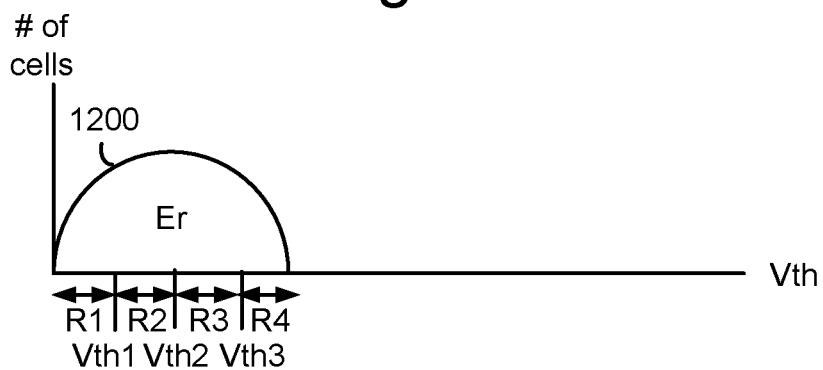
FIG. 12C depicts examples of Vth changes for the memory cells having the erased state Vth distribution 1200, and classifying the memory cells based on the Vth changes, consistent with the processes of FIGS. 10C and 10E.

Step 1043 includes classifying each memory as having a high Tco if the change in Vth exceeds a threshold. Otherwise, classify the memory cell as having a low Tco. See also FIGS. 12B, 12C and 12E. The Vth may exceed the threshold when the Vth crosses at least one range when sensed using the different sensing conditions. For example, FIG. 12B depicts ranges R1-R4. If the sensed Vth of a memory cell changes between R1 and R2, R2 and R3 or R3 and R4, the threshold is not exceeded. If the sensed Vth of a memory cell changes between R1 and R3, R2 and R4, or R1 and R4, the threshold is exceeded.

By using a relatively high bit line voltage during sensing, the NAND string current is relatively high for a given memory cell Vth, so that the Vth of the memory cell appears to be relatively low. Similarly, by using a relatively long sense time, the Vth of the memory cell appears to be relatively low.

This example involves sensing a memory cell relative to three Vth levels and four Vth ranges, and classifying the memory cell into one of two Tco groups. The example can be extended to sensing a memory cell relative to additional Vth levels and classifying the memory cell into additional Tco groups.

In one approach, to classify the different WL0 memory cells into the different groups according to the different temperature coefficients, a control circuit is configured to sense each memory cell of the different memory cells using a first sense time and a using a second sense time.

In another approach, each of the different WL0 memory cells is in a respective NAND string; each NAND string is connected to a respective bit line; and to classify the different memory cells into the different groups according to the different temperature coefficients, a control circuit is configured to sense each memory cell of the different memory cells using a first voltage on the respective bit line and using a second voltage on the respective bit line.

Figure 11A:
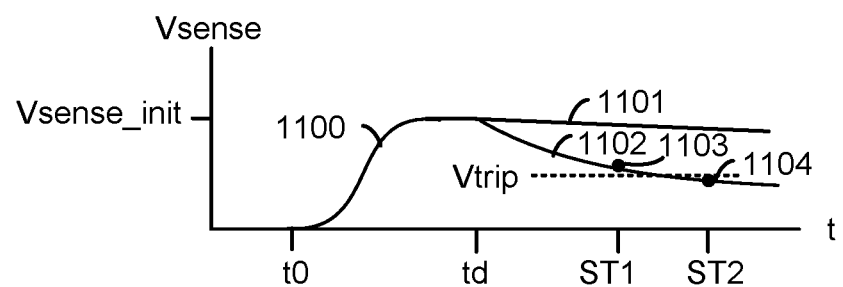
FIG. 11A depicts a plot of a sense node voltage versus time during a sensing operation, showing the use of different sense times, consistent with step 1012 of FIG. 10B, step 1021 of FIG. 10C and step 1032 of FIG. 10D.
Figure 11B:
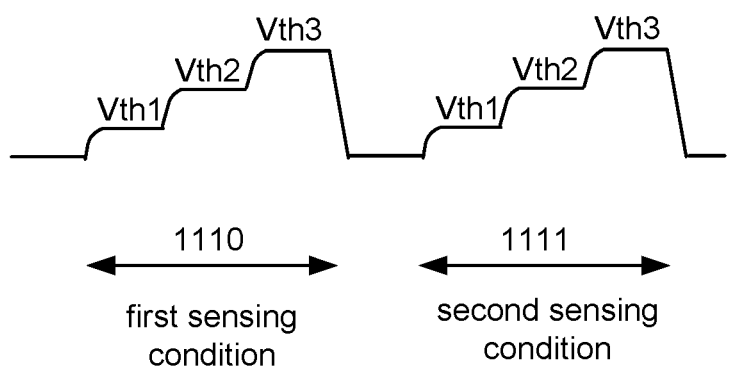
FIG. 11B depicts an example plot of word line voltages which can be used in the process of FIG. 10E.

FIG. 11A depicts a plot of a sense node voltage versus time during a sensing operation, showing the use of different sense times, consistent with step 1012 of FIG. 10B, step 1021 of FIG. 10C and step 1032 of FIG. 10D. As mentioned in connection with FIG. 2, during a sensing operation, the comparison circuit 175 determines whether the voltage of the sense node has discharged below a trip voltage, Vtrip, at a specified time which is the sense time ST. By using different sense times, the Vth against which a memory cell is tested can be varied. Similarly, by using different bit line voltages, the Vth against which a memory cell is tested can be varied.

In this example, the amount of discharge of the sense node is sensed relative to a trip voltage at first and second sense times, ST1 and ST2, respectively. The vertical axis depicts Vsense, a sense node voltage and the horizontal axis depicts time.

A plot 1100 depicts the increase of the sense node voltage to Vsense_init due to the charging process which begins at t0. At a discharge time, td, the sense node is allowed to discharge through the bit line and the NAND string. The time periods of ST1-td or ST2-td are sense periods or integration times. The amount of discharge is limited by the conductivity of the memory cell being sensed. If the memory cell is in a strongly non-conductive state (plot 1101), Vsense does not fall below Vtrip at the sense time. If the memory cell is in a moderately conductive state, plot 1102 at point 1103 shows that Vsense>Vtrip so that the memory cell will be sensed as being in a non-conductive state if the sense time is at ST1. Plot 1102 at point 1104 shows that Vsense<Vtrip so that the memory cell will be sensed as being in a conductive state if the sense time is at ST2.

FIG. 11B depicts an example plot of word line voltages which can be used in the process of FIG. 10E. In one approach, the memory cells are sensed during the application of each of the word line voltages Vth1-Vth3 using a first sensing condition in a time period represented by the arrow 1110, and the sensing results are transferred to the controller. This sensing identifies the Vth as being in one of the Vth ranges R1-R4 in FIG. 12B, 12C or 12E. The memory cells are sensed again during the application of each of the word line voltages Vth1-Vth3 using a second sensing condition in a time period represented by the arrow 1111, and the sensing results are transferred to the controller. This sensing also identifies the Vth as being in one of the Vth ranges R1-R4 in FIG. 12B, 12C or 12E. Other approaches are possible as well. For example, the memory cells could be sensed twice during the application of each word line voltage—once using the first sensing condition and once using the second sensing condition.

In one approach, the first sensing condition includes a low sense time and a low bit line voltage, and the second sensing condition includes a high sense time and a low bit line voltage. In another approach, the first sensing condition includes a low sense time and a low bit line voltage, and the second sensing condition includes a low sense time and a high bit line voltage. In another approach, the first sensing condition includes a low sense time and a low bit line voltage, and the second sensing condition use a high sense time and a high bit line voltage.

FIG. 12A depicts example Vth distributions obtained when programming memory cells to a test Vth distribution, consistent with step 1011 of FIG. 10B. In FIG. 12A-12E, the vertical axis depicts a number of memory cells and the horizontal axis depicts Vth. The memory cells are programmed from the erased state, as represented by the Vth distribution 1200, to a test Vth distribution 1201 using a verify voltage Vv_test. This can be analogous to programming using a single bit, where a single programmed state is used. In some cases, the test Vth distribution is narrower than the erased state Vth distribution so that changes in the Vth of the memory cells can be detected more accurately when a specified number of Vth ranges are used.

FIG. 12B depicts examples of Vth changes for the memory cells having the Vth distribution 1201 of FIG. 12A when using multiple sensing conditions, and classifying the memory cells into groups based on the Vth changes, consistent with the processes of FIGS. 10B and 10E. The sensing may use the word line voltages Vth1-Vth3 of FIG. 11B, for example, where different voltage ranges R1-R4 extend adjacent to and between the word line voltages. R1 corresponds to a Vth of less than Vth1, R2 corresponds to a Vth between Vth1 and Vth2, R3 corresponds to a Vth between Vth2 and Vth3, and R4 corresponds to a Vth greater than Vth3.

As mentioned, the adjusting of the sense conditions results in changing the sensed Vth (and Vth range) of the memory cells. This change in the sensed Vth corresponds with a subthreshold slope of a memory cell, where a higher subthreshold slope (and a higher Tco) is correlated with a larger change in the Vth of the memory cell under the different sensing conditions, and a lower subthreshold slope (and a lower Tco) is correlated with a smaller change in the Vth of the memory cell under the different sensing conditions.

Different examples of the sensing results are depicted by the horizontal lines, where the square ends of each horizontal line represent the Vth ranges obtained using first and second sensing conditions. A first example is provided by the diagram 1205, where the Vth of a memory cell is sensed as being in R1 and R2 using the different sensing conditions. A second example is provided by the diagram 1206, where the Vth of a memory cell is sensed as being in R2 and R3 using the different sensing conditions. A third example is provided by the diagram 1207, where the Vth of a memory cell is sensed as being in R3 and R4 using the different sensing conditions. In the first-third examples, the change in Vth extends only between adjacent ranges so that the memory cell is classified as having a low Tco.

A fourth example is provided by the diagram 1208, where the Vth of a memory cell is sensed as being in R1 and R3 using the different sensing conditions. A fifth example is provided by the diagram 1209, where the Vth of a memory cell is sensed as being in R2 and R4 using the different sensing conditions. In these examples, the change in Vth extends between non-adjacent ranges so that the memory cell is classified as having a high Tco. In particular, the Vth extends across three ranges.

A sixth example is provided by the diagram 1210, where the Vth of a memory cell is sensed as being in R1 and R4 using the different sensing conditions. In this example, the change in Vth again extends between non-adjacent ranges so that the memory cell is classified as having a high Tco. In particular, the Vth extends across four ranges.

In the above example, Tco is classified into two classes based on the number of ranges encompassed by the Vth of a memory cell using the different sensing conditions. For example, if the Vth of a memory cell extends across only two adjacent ranges, it is classified as having a low Tco, and if the Vth of a memory cell extends across three or more ranges, it is classified as having a high Tco.

Optionally, the Tco could be classified into three or more classes based on the number of ranges encompassed by the Vth of a memory cell using the different sensing conditions. For example, if the Vth of a memory cell extends across two, three or four ranges, it can be classified as having a low, medium or high Tco, respectively. For example, the memory cells represented by the diagrams 1205-1207, 1208 and 1209, and 1210 could be classified as having a low, medium and high Tco, respectively.

The word line voltages Vth1-Vth3 can be set based on the extent of the Vth distribution 1201, which can be estimated based on prior testing. The word line voltages may be equidistant and divide the Vth distribution into four roughly equal ranges, in this example.

Note that additional Vth ranges can be used which extend above and/or below the upper and lower tail of the Vth distribution 1201. Additionally, the sensing conditions can be adjusted if a memory cell is determined to be in the same Vth range using the first and second sensing conditions. Sensing conditions can be applied which result in the Vth extending between different Vth ranges in order to measure the subthreshold slope of the memory cell.

FIG. 12C depicts examples of Vth changes for the memory cells having the erased state Vth distribution 1200, and classifying the memory cells based on the Vth changes, consistent with the processes of FIGS. 10C and 10E. The word line voltages Vth1-Vth3 and associated ranges R1-R4 are depicted. The classification of the memory cell into different Tco groups can proceed as discussed in connection with FIG. 12B.

Figure 12D:
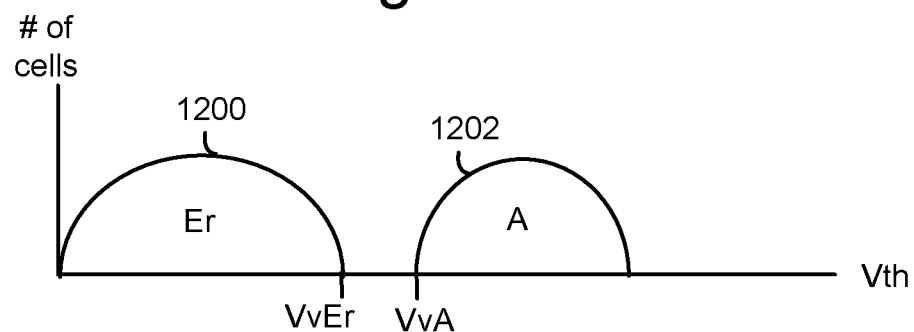
FIG. 12D depicts example Vth distributions when programming memory cells to an A-state Vth distribution, consistent with step 1031 of FIG. 10D.

FIG. 12D depicts example Vth distributions when programming memory cells to an A-state Vth distribution, consistent with step 1031 of FIG. 10D. The A-G state memory cells are programmed from the erased state, as represented by the Vth distribution 1200, to the A state, as represented by the Vth distribution 1202 using a verify voltage VvA.

Figure 12E:
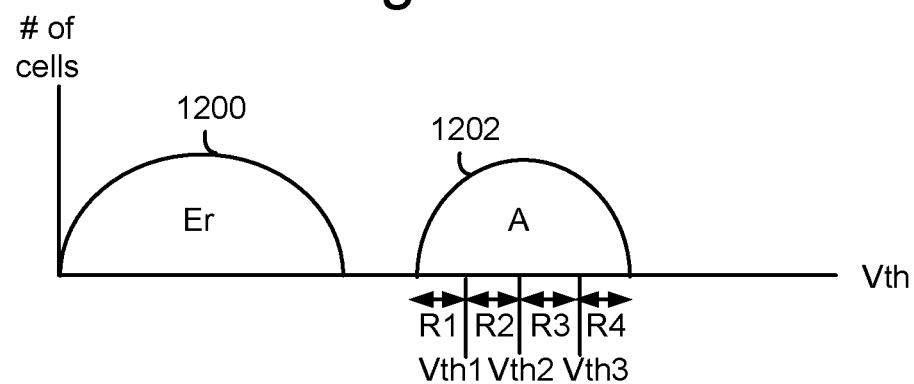
FIG. 12E depicts examples of Vth changes for the memory cells having the A-state Vth distribution 1202 of FIG. 12D using multiple sensing conditions, and classifying the memory cells based on the Vth changes, consistent with the processes of FIGS. 10D and 10E.

FIG. 12E depicts examples of Vth changes for the memory cells having the A-state Vth distribution 1202 of FIG. 12D using multiple sensing conditions, and classifying the memory cells into groups based on the Vth changes, consistent with the processes of FIGS. 10D and 10E. The word line voltages Vth1-Vth3 and associated ranges R1-R4 are depicted. The classification of the memory cell into different Tco groups can proceed as discussed in connection with FIG. 12B.

Figure 13C:
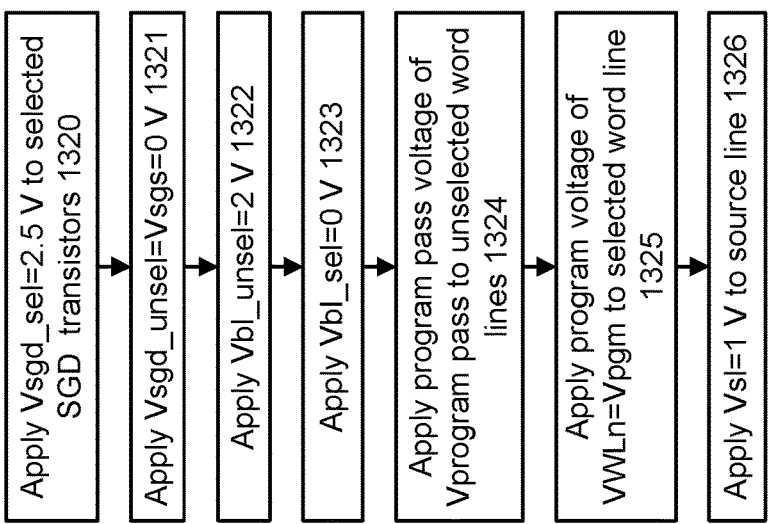
FIG. 13C depicts a flowchart of an example process for performing the program phase of step 1303 of FIG. 13A.
Figure 13B:
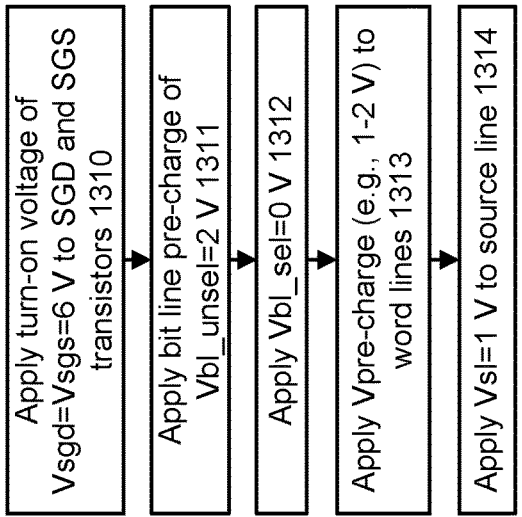
FIG. 13B depicts a flowchart of an example process for performing the pre-charge phase of step 1302 of FIG. 13A.
Figure 13A:
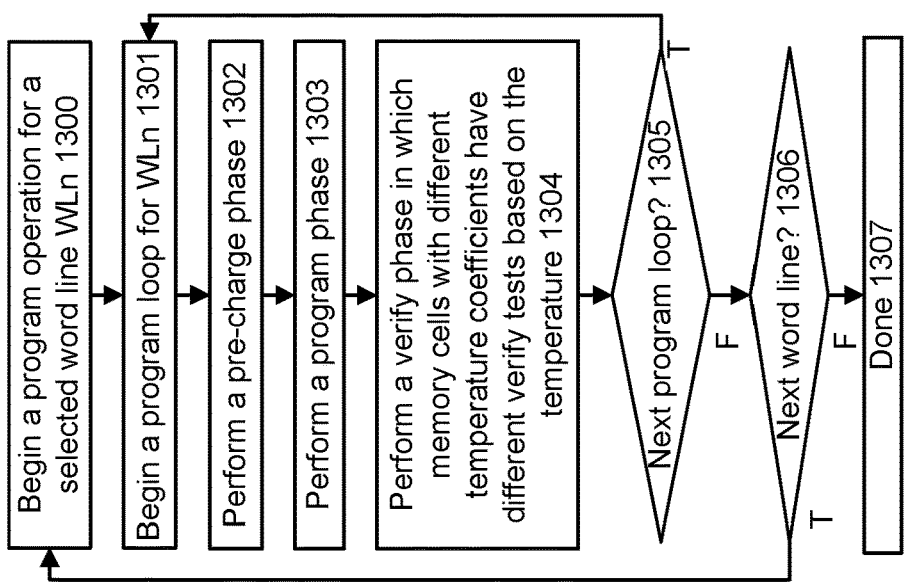
FIG. 13A depicts a flowchart of an example implementation of a process for programming memory cells consistent with FIG. 10A.

FIG. 13A depicts a flowchart of an example implementation of a process for programming memory cells consistent with FIG. 10A. A program operation can include a series of program loops such as discussed in connection with FIG. 14A. Step 1300 begins a program operation for a selected word line, WLn. Step 1301 begins a program loop for WLn. Step 1302 performs a pre-charge phase of the program loop. Step 1303 performs a program phase of the program loop. Step 1304 performs a verify phase of the program loop in which memory cells with different temperature coefficients have different verify tests based on the temperature. See also FIG. 14C, which depicts the pre-charge, program and verify phases 1407-1409, respectively.

A decision step 1305 determines if there is a next program loop. A next program loop is performed is the program operation is not yet completed. If the decision step 1305 is true, step 1301 is repeated by starting the next program loop. If the decision step 1305 is false, a decision step 1306 determines if there is a next word line to program. If the decision step 1306 is true, a next word line is selected at step 1300. If the decision step 1306 is false, step 1307 indicates the program operation is done.

FIG. 13B depicts a flowchart of an example process for performing the pre-charge phase of step 1302 of FIG. 13A. Step 1310 includes applying a turn-on voltage of Vsgd=Vsgs=6 V to the SGD and SGS transistors, to provide them in a strongly conductive state. Step 1311 includes applying a bit line pre-charge of Vbl_unsel=2 V. Step 1312 includes applying Vbl_sel=0 V to the bit lines of the selected NAND strings. Step 1313 includes applying a pre-charge voltage of 1-2 V to the word lines. This provides the associated channel regions in a conductive state to pass the bit line voltage into the channel. Step 1314 includes applying Vsl=1 V to the source line. This provides a back bias for the SGS transistors to reduce leakage. The steps may be performed concurrently. The voltages depicted in the various figures are examples.

FIG. 13C depicts a flowchart of an example process for performing the program phase of step 1303 of FIG. 13A. Step 1320 includes applying Vsgd_sel=2.5 V to the selected SGD transistors, e.g., the SGD transistors in a selected sub-block. Step 1321 includes applying Vsgd_unsel=Vsgs=0 V. Vsgd_unsel is for the SGD transistors in the unselected sub-blocks. This provides the unselected SGD transistors in a non-conductive state. Step 1322 includes applying Vbl_unsel=2 V to the inhibited bit lines. This provides the associated SGD transistors in a non-conductive state to allow channel boosting to occur. Step 1323 include applying Vbl_sel=0 V to the programmed bit lines. This provides the associated SGD transistors in a conductive state to allow programming to occur. Step 1324 includes applying a program pass voltage of Vprogram pass=8-10 V to the unselected word lines. This boosts the associated channel regions in the inhibited or unselected NAND strings. Step 1325 includes applying a program voltage of VWLn=Vpgm (e.g., 20-30 V) to the selected word line. This provides a high gate-to-channel voltage which programs the WLn memory cells in the selected NAND strings. Step 1326 includes applying Vsl to the source line. This continues to provide a back bias for the SGS transistors to reduce leakage. The steps may be performed concurrently.

Figure 13D:
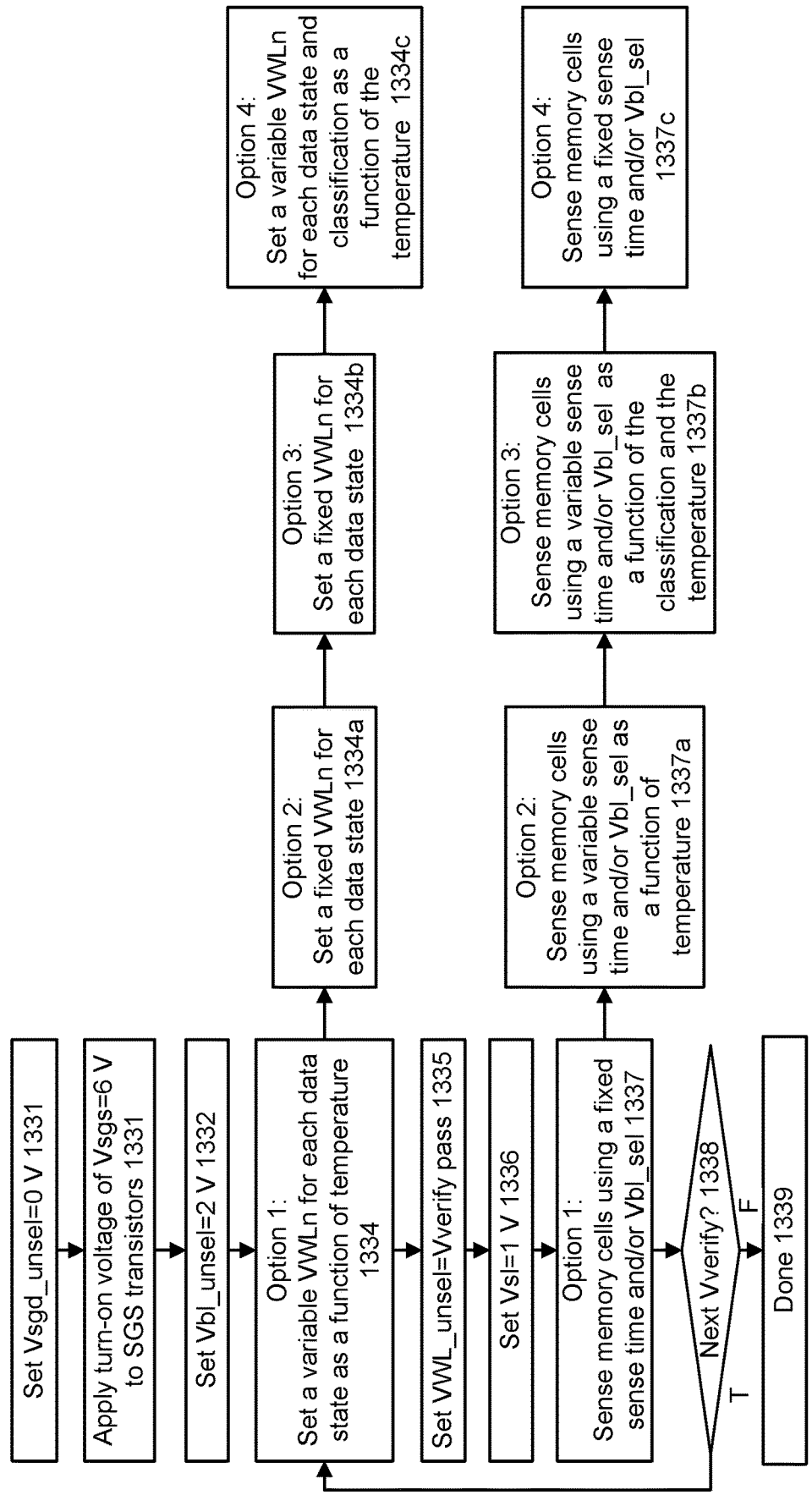
FIG. 13D depicts a flowchart of example processes for performing the verify phase of step 1304 of FIG. 13A.

FIG. 13D depicts a flowchart of example processes for performing the verify phase of step 1304 of FIG. 13A. The processes include a first option (Option 1), represented by steps 1334 and 1337, a second option (Option 2) represented by steps 1334*a* and 1337*a*, a third option (Option 3) represented by steps 1334*b* and 1337*a*, and a fourth option (Option 4) represented by steps 1334*c* and 1337*b*. The remaining steps can be used with each option. In Options 1 and 2, the memory cells are not sensed to classify their Tco. Instead, the Tco is assumed to correspond to the program speed. The lockout condition is then adjusted based on the programming speed using either VWLn (Option 1) or the sense time and/or Vbl (Option 2). In Options 3 and 4, the memory cells are sensed to classify their Tco. Option 3 involves adjusting the sense time and/or bit line voltage (but not the word line voltage, in one approach) based on the classification and the temperature, and Option 4 involves adjusting the word line voltage (but not the sense time and/or bit line voltage, in one approach) based on the classification and the temperature. Options 2 and 3 involve adjusting the sense circuit parameters rather than the word line voltage.

Step 1331 sets Vsgd_unsel=0 V. Step 1332 includes applying a turn-on voltage of Vsgs=6 V to the SGS transistors. Step 1333 includes setting Vbl_unsel=2 V. Step 1334 (Option 1) includes setting a variable VWLn for each data state as a function of temperature. See FIGS. 15A and 15B.

Step 1335 includes setting VWLunsel=Vverify pass, a verify pass voltage, such as 8-10 V. Step 1336 includes setting Vsl=1 V. Step 1337 (Option 1) includes sensing the memory cells using a fixed sense time and/or Vbl_sel (the bit line voltage for a selected NAND string being programmed). A decision step 1338 determines if there is a next Vverify to apply to WLn. If the decision step 1338 is true, step 1334 is repeated by applying the next VWLn. If the decision step 1338 is false, step 1339 indicates the process is done.

The steps may be performed concurrently.

In Option 2, step 1334*a* includes setting a fixed VWLn for each data state. See FIG. 15C. Step 1337*a* includes sensing memory cells using a variable sense time (see FIGS. 16A and 16B) and/or Vbl_sel (see FIGS. 17A and 17B) as a function of the temperature.

In Option 3, step 1334*b* includes setting a fixed VWLn for each data state. See FIG. 15C. Step 1337*a* includes sensing memory cells using a variable sense time and/or Vbl_sel as a function of the classification and the temperature.

In Option 4, step 1334*c* includes setting a variable VWLn for each data state and classification as a function of the temperature. See FIGS. 15D1 and 15D2. Step 1337*b* includes sensing the memory cells using a fixed sense time and/or Vbl_sel.

FIG. 14A depicts an example voltage signal used in a program operation, consistent with FIG. 13A. The voltage signal 1400 includes a set of program voltages, including an initial program voltage 1401, which are applied to a word line selected for programming. The initial program voltage is represented by Vpgm_init and dVpgm denotes the step size. A single program pass is used having 22 program loops or program-verify iterations, as an example. The verification signals in each program loop, including example verification signals 1402, can encompass lower assigned data states, then midrange assigned data states and then higher assigned data states as the program operations proceeds, as depicted in FIG. 14B.

The example verification signals depict three verify voltages as a simplification. As used herein, a verification signal comprises a signal which is applied to a selected word line during a program loop after the application of a program voltage to the selected word line. The verification signal is part of a sensing operation. Memory cells are sensed during the application of the verification signal to judge their programming progress. A verification signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. The data of the lower and upper pages can be determined by reading the memory cells using read voltages of VrA and VrC; and VrB, respectively.

With three bits per cell, three pages of data can be stored in the memory cells connected to a word line. The data of the lower, middle and upper pages can be determined by reading the memory cells using read voltages of VrA and VrE; VrB; and VrC and VrG, respectively.

FIG. 14B depicts an example of verify tests for different data states in different program loops of FIG. 14A. The horizontal bars are time-aligned with the program loop axis of FIG. 14A. The bars overlap in some program loops, indicating that verify operations can be performed for multiple data states in the program loop. With eight data states, the bars indicate that verify voltages for the A, B, C, D, E, F and G states are applied in verification signals in program loops 1-5, 4-8, 7-11, 10-14, 13-17, 16-20 and 19-22, respectively. As mentioned, the verification signals in each program loop can encompass lower assigned data states, then midrange assigned data states and then higher assigned data states as the program operation proceeds.

In one approach, the verify tests for a data state is performed at a predetermined range of program loops. In another approach, the verify tests for one data state begin based on the program progress of a lower data state. For example, the verify tests for the B state may begin when a specified portion of the A state memory cells have passed their verify test, the verify tests for the C state begin when a specified portion of the B state memory cells have passed their verify test, and so forth.

FIG. 14C depicts example voltage signals for performing the process of FIG. 13A. The vertical dimension denotes voltage and the horizontal dimension denotes time, with time points t0-t11. The period of time depicted corresponds to one program loop and includes a pre-charge phase 1407 (t0-t2), a program phase 1408 (t2-t8) and a verify phase 1409 (t9-t11). Voltage signals 1405, 1410, 1420, 1430 and 1440 depict VWLn, VWL_unsel, Vsgd, Vbl and Vsl, respectively. A voltage pulse 1406 is applied during the program phase and one or more verify pulses 1411 and 1412 (with magnitudes of VvA and VvB, respectively) are applied during the verify phase. The verify pulses can also have magnitudes such as depicted in FIGS. 15A-15C, 15D1 and 15D2. The verify pulses are word line verify voltages.

In the pre-charge phase, VWLn and VWL_unsel can be set to a pre-charge voltage such as 1-2 V, for example.

A positive Vbl (e.g., 2 V) is provided to the drain-side channels of the inhibited NAND strings to remove residue electrons and to provide a small amount of boosting such as 1-2 V. The SGD transistors of the selected and unselected sub-blocks are in a conductive state at this time, with a voltage of Vsgd=6 V, for example. This allows the bit line voltage to be passed to the drain end channel. It is also possible for the SGS transistors of the selected and unselected sub-blocks to be in a conductive state at this time, with a voltage of 6 V, for example to allow Vsl to be passed to the source end of the channel.

Vsgd is set to 6 V to pass the bit line voltage to the drain ends of the NAND strings.

In the program phase, VWLn and Vwl_unsel are ramped up, e.g., starting at t3, to provide a capacitive coupling up of the channels of the inhibited NAND strings. VWLn is then ramped up further at t5 to the peak program pulse level of Vpgm and held at Vpgm until t6. After the application of the program pulse, the word line voltages are ramped down in a recovery process. During the application of the program pulse, Vsgd_sel (plot 1421) is high enough, e.g., 2.5 V, to provide the selected SGD transistors in a conductive state for the selected NAND strings, which receive Vbl_sel=0 V (plot 1432), but low enough to provide the selected SGD transistors in a non-conductive state for the inhibited NAND strings, which receive Vbl_unsel=2 V (plot 1431). Vsgd_unsel (plot 1422) is low (e.g., 0 V) to provide the unselected SGD transistors in a non-conductive state for the unselected NAND strings, Subsequently, in the verify phase, one or more verify tests are performed by applying one or more verify voltages on WLn and, for each verify voltage, sensing the conductive state of the memory cells in the selected NAND strings of the selected sub-block. The SGD and SGS transistors are in a strongly conductive state to allow sensing to occur for the selected memory cells. The verify voltages are VvV and VvB in this example.

Figure 15A:
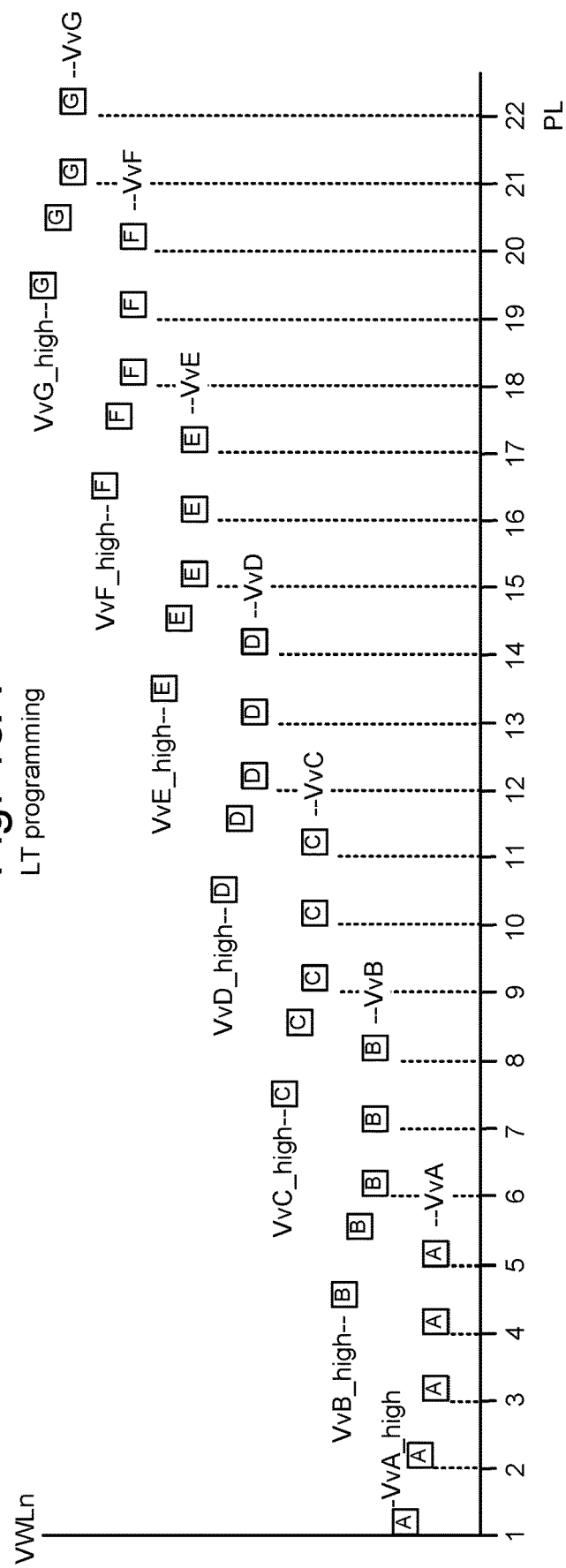
FIG. 15A depicts a plot of word line verify voltage versus program loop number for use in the process of FIG. 13D, Option 1, where the programming is performed at a low temperature (LT).

FIG. 15A depicts a plot of word line verify voltage versus program loop number for use in the process of FIG. 13D, Option 1, where the programming is performed at a low temperature. In FIG. 15A-15D2, the vertical axis represents a word line verify voltage (VWLn) and the horizontal axis represents a program loop number. Each square represents a verify voltage for an assigned data state, A-G, in this example. FIG. 15A-15D2 are also consistent with FIGS. 14A and 14B.

For the verify tests of each data state, the verify voltage starts at a high level, VvA_high-VvG_high, and steps down to a nominal level, VvA-VvG, respectively, for states A-G, respectively, as successive program loops are performed. Successive program loops refer to program loops which follow one another in order without interruption. For example, PL1-PL3 are successive program loops. For the A state verify tests, VvA_high is applied in PL1, an intermediate A state verify voltage (between VvA_high and VvA) is applied in PL2 and VvA is applied in PL3-5. Similarly, for the B state verify tests, VvB_high is applied in PL4, an intermediate B state verify voltage (between VvB_high and VvB) is applied in PL5 and VvB is applied in PL6-8.

For the C state verify tests, VvC_high is applied in PL7, an intermediate C state verify voltage (between VvC_high and VvC) is applied in PL8 and VvC is applied in PL9-11. For the D state verify tests, VvD_high is applied in PL10, an intermediate D state verify voltage (between VvD_high and VvD) is applied in PL11 and VvD is applied in PL12-14. For the E state verify tests, VvE high is applied in PL13, an intermediate E state verify voltage (between VvE high and VvE) is applied in PL14 and VvE is applied in PL15-17. For the F state verify tests, VvF high is applied in PL16, an intermediate F state verify voltage (between VvF high and VvF) is applied in PL17 and VvF is applied in PL18-20. For the G state verify tests, VvG_high is applied in PL19, an intermediate G state verify voltage (between VvG_high and VvG) is applied in PL20 and VvG is applied in PL21 and 22.

By applying a high verify voltage and then an intermediate verify voltage in the initial program loops for a data state, the faster programming memory cells (which are likely to be the high Tco memory cells) reach the lockout condition when applying the high or intermediate verify voltage. As a result, these memory cells are programmed to a relatively high position in the Vth distribution, as discussed in connection with FIG. 8D, diagram 870. If the memory cells are subsequently read at a high temperature, the Vth of the high Tco memory cells downshifts to the voltage represented by the square 872 rather than voltage represented by the square 865 in FIG. 8C, so that the widening of the Vth distribution is reduced. The slow programming memory cells (which are likely to be the low Tco memory cells) reach the lockout condition when applying the nominal verify voltage.

This example uses three word line verify voltages for each programmed data state. Other options can use two or more word line verify voltages for each data state. Also, multiple word line verify voltages can be used for fewer than all programmed data states. Further, the increment between the high verify voltage and the nominal verify voltage can be a function of the data state. For example, testing may indicate that the amount of Vth widening due to temperature changes is a function of the data state. In this case, the increment can be greater for data states with a greater amount of Vth widening.

The increment between the high verify voltage and the nominal verify voltage can also be a function of temperature. For example, the increment may be greater when the temperature is colder, e.g., below a lower temperature threshold such as 25 C. The increment may become progressively greater as the temperature becomes progressively colder. The number of word line verify voltages can also differ for different data states. Also, while the verify voltage steps down in each program loop from a high level to the nominal level in this example, the high or intermediate verify voltage can be repeated in multiple adjacent program loops before stepping down in a next program loop.

Figure 15B:
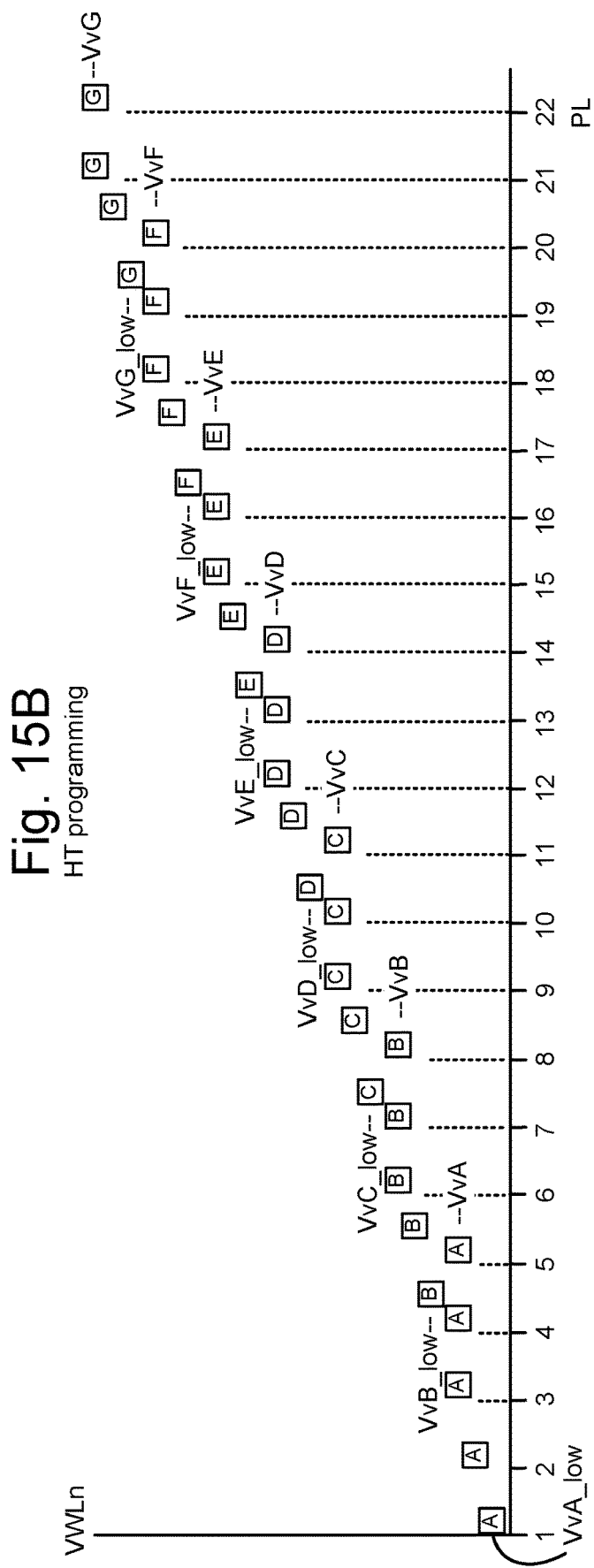
FIG. 15B depicts a plot of word line verify voltage versus program loop number for use in the process of FIG. 13D, Option 1, where the programming is performed at a high temperature (HT).

Similar approaches can be used in FIG. 15B.

Note that a value such as a voltage or time as discussed herein which is low, medium or high can refer to a value which is relatively low, medium or high, respectively. A high value is greater than a medium value and a medium value is greater than a low value.

FIG. 15B depicts a plot of word line verify voltage versus program loop number for use in the process of FIG. 13D, Option 1, where the programming is performed at a high temperature. For the verify tests of each data state, the verify voltage starts at a low level, VvA_low-VvG_low, and steps up to a nominal level, VvA-VvG, respectively, for states A-G, respectively, as successive program loops are performed. For example, for the A state verify tests, VvA_low is applied in PL1, an intermediate A state verify voltage (between VvA_low and VvA) is applied in PL2 and VvA is applied in PL3-5. Similarly, for the B state verify tests, VvB_low is applied in PL4, an intermediate B state verify voltage (between VvB_low and VvB) is applied in PL5 and VvB is applied in PL6-8.

For the C state verify tests, VvC_low is applied in PL7, an intermediate C state verify voltage (between VvC_low and VvC) is applied in PL8 and VvC is applied in PL9-11. For the D state verify tests, VvD_low is applied in PL10, an intermediate D state verify voltage (between VvD_low and VvD) is applied in PL11 and VvD is applied in PL12-14. For the E state verify tests, VvE low is applied in PL13, an intermediate E state verify voltage (between VvE low and VvE) is applied in PL14 and VvE is applied in PL15-17. For the F state verify tests, VvF low is applied in PL16, an intermediate F state verify voltage (between VvF low and VvF) is applied in PL17 and VvF is applied in PL18-20. For the G state verify tests, VvG_low is applied in PL19, an intermediate G state verify voltage (between VvG_low and VvG) is applied in PL20 and VvG is applied in PL21 and 22.

By applying a low verify voltage and then an intermediate verify voltage in the initial program loops for a data state, the faster programming memory cells (which are likely to be the high Tco memory cells) reach the lockout condition when applying the low or intermediate verify voltage. As a result, these memory cells are programmed to a relatively low position in the Vth distribution, as discussed in connection with FIG. 8F, diagram 883. If the memory cells are subsequently read at a low temperature, the Vth of the high Tco memory cells upshifts to the voltage represented by the square 885 rather than voltage represented by the square 878 in FIG. 8E, so that the widening of the Vth distribution is reduced. The slow programming memory cells (which are likely to be the low Tco memory cells) reach the lockout condition when applying the nominal verify voltage.

The increment between the low verify voltage and the nominal verify voltage can be a function of the data state. Also, while the verify voltage steps up in successive program loops from a low level to the nominal level in this example, the low or intermediate verify voltage can be repeated in multiple adjacent program loops before stepping up in a next program loop.

FIGS. 15A and 15B show that, in each program-verify iteration of a program operation, a program pulse is applied to the word line after which a verify pulse for a data state is applied to the word line while sensing is performed, and the verify pulses for the assigned data state change over successive program-verify iterations.

Figure 15C:
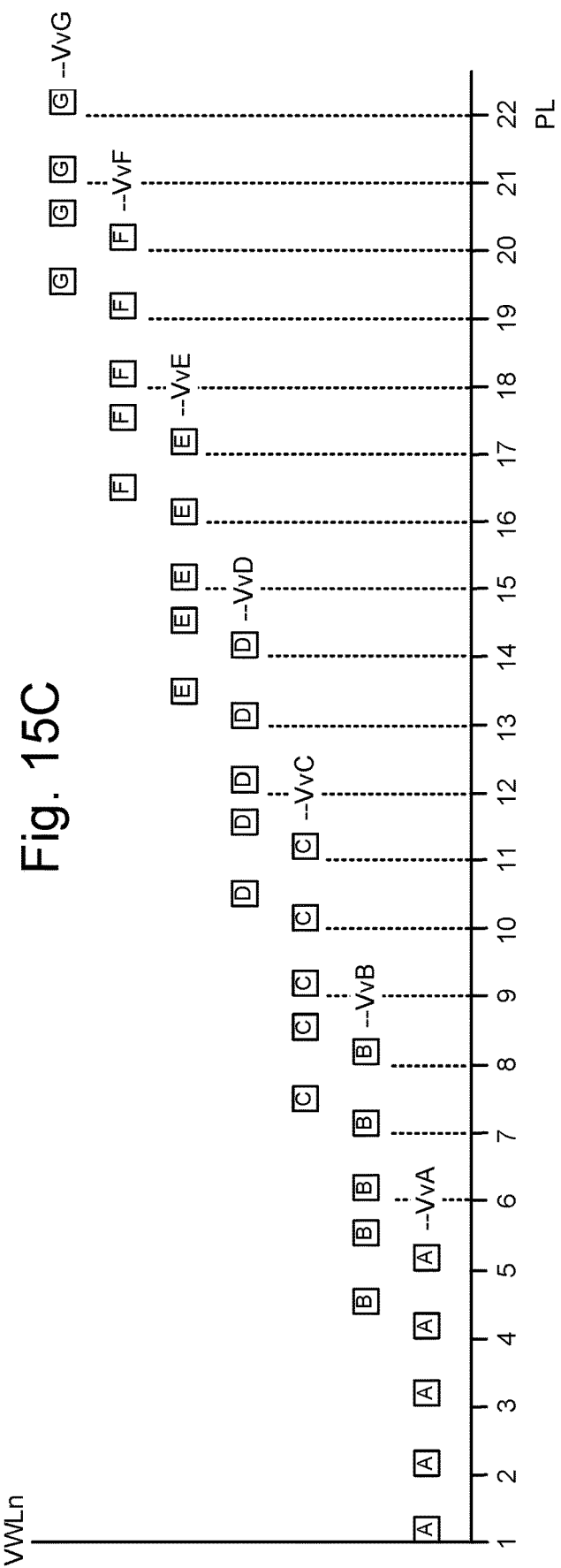
FIG. 15C depicts a plot of word line verify voltage versus program loop number for use in the process of FIG. 13D, Option 3.

FIG. 15C depicts a plot of word line verify voltage versus program loop number for use in the process of FIG. 13D, Option 3. In this option, a fixed VWLn is used for each data state, while the sense time and/or Vbl is varied to adjust the lockout condition. With eight data states, the squares indicate that verify voltages for the A-G states (VvA-VvG, respectively) are applied in verification signals in program loops 1-5, 4-8, 7-11, 10-14, 13-17, 16-20 and 19-22, respectively. During the application of a word line verify voltage, different memory cells can be sensed concurrently using different sense times and/or Vbl according to their classification. This approach is efficient since the sensing of the different cells using different verify tests can occur concurrently. For example, a low Tco A state memory cell and a high Tco A state memory cell can be verified at the same time.

FIG. 15D1 depicts a plot of word line verify voltage versus program loop number for use in the process of FIG. 13D, Option 4, for PL1-11. FIGS. 15D1 and 15D2 represent the program loops of one program operation. In this option, multiple levels of VWLn are used for each data state to adjust the lockout condition, while a fixed sense time and/or Vbl are also used. As an example, there are two different levels of VWLn (a high level and a low level) for each data state represented by two rows of squares. For a given data state, each level of WLn is used to verify a different Tco group of memory cells. The memory cells of a Tco group are sensed while a verify voltage which is a function of the group is applied to the word line.

The squares are staggered to show that sensing during the application of the high level VWLn occurs separately in time from the sensing during the application of the high level VWLn. Thus, the sensing occurs separately for memory cells with different Tco classifications but concurrently for memory cells with a common Tco classification. This approach uses more time compared to the approach of FIG. 15C but can be simpler to implement. The corresponding VWLn for a memory cell can be determined by reading the data in the corresponding TCO latch of the NAND string to determine the Tco classification, as well as reading data in the latches which identify the assigned data state. A verify test is performed when the corresponding VWLn is applied, assuming the memory cell has not yet reached the lockout condition. A verify test is not performed when a non-corresponding VWLn is applied.

The plot is applicable to programming at high or low temperatures. At low temperatures, the memory cells classified as having a high or low Tco can be sensed using the high or low VWLn, respectively. At high temperatures, the memory cells classified as having a high or low Tco can be sensed using the low or high VWLn, respectively.

The plot shows that verify tests using high and low word line verify voltages occur for the A state in PL1-5, for the B state in PL4-8, for the C state in PL7-11 and for the D state in PL10 and 11.

FIG. 15D2 depicts a plot of word line verify voltage versus program loop number for use in the process of FIG. 13D, Option 4, for PL12-22. The plot follows the plot of FIG. 15D1. The plot shows that verify tests using high and low word line verify voltages occur for the D state in PL12-14, for the E state in PL13-17, for the F state in PL16-20 and for the G state in PL19-22.

Figure 16A:
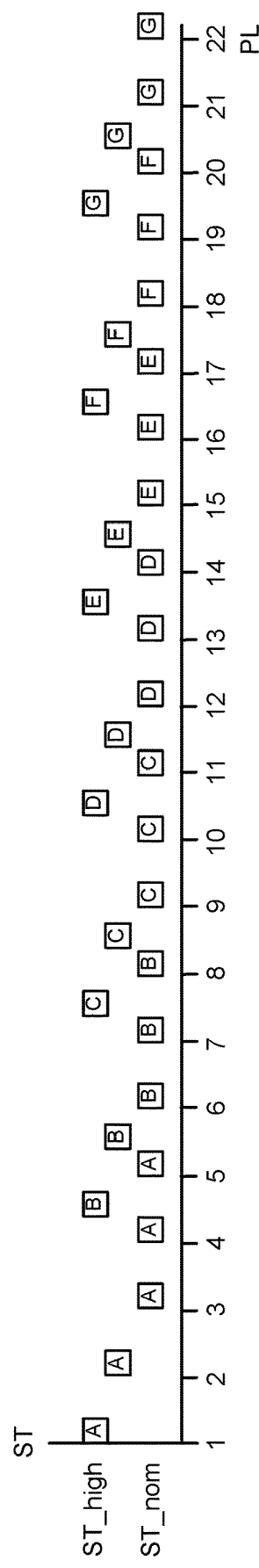
FIG. 16A depicts a plot of sense time versus program loop number for use in the process of FIG. 13D, Option 2, where the programming is performed at a low temperature.
Figure 16B:
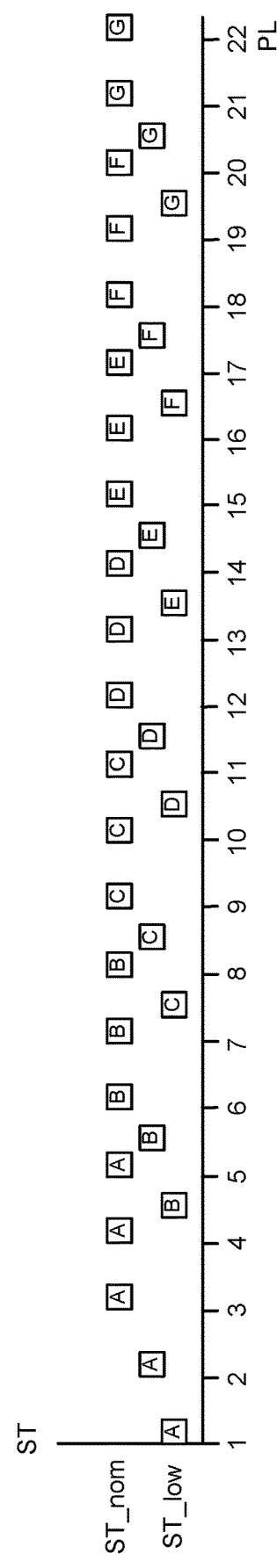
FIG. 16B depicts a plot of sense time versus program loop number for use in the process of FIG. 13D, Option 2, where the programming is performed at a high temperature.

FIG. 16A depicts a plot of sense time versus program loop number for use in the process of FIG. 13D, Option 2, where the programming is performed at a low temperature. In FIGS. 16A and 16B, the vertical axis represents a sense time (ST) and the horizontal axis represents a program loop number. Each square represents a sense time for an assigned data state, A-G, in this example. FIGS. 16A and 16B are also consistent with FIGS. 14A and 14B. For the verify tests of each data state, the sense time starts at a high level, ST_high, and steps down to a nominal level, ST_nom, respectively, for states A-G as successive program loops are performed. For example, for the A state verify tests, ST_high is applied in PL1, an intermediate ST (between ST_high and ST_nom) is applied in PL2 and ST_nom is applied in PL3-5. Similarly, for the B state verify tests, ST_high is applied in PL4, the intermediate ST is applied in PL5 and ST_nom is applied in PL6-8.

For the C state verify tests, ST_high is applied in PL7, the intermediate ST is applied in PL8 and ST_nom is applied in PL9-11. For the D state verify tests, ST_high is applied in PL10, the intermediate ST is applied in PL11 and ST_nom is applied in PL12-14. For the E state verify tests, ST_high is applied in PL13, the intermediate ST is applied in PL14 and ST_nom is applied in PL15-17. For the F state verify tests, ST_high is applied in PL16, the intermediate ST is applied in PL17 and ST_nom is applied in PL18-20. For the G state verify tests, ST_high is applied in PL19, the intermediate ST is applied in PL20 and ST_nom is applied in PL21 and 22.

By using a high sense time and then an intermediate sense time in the initial program loops for a data state, the faster programming memory cells (which are likely to be the high Tco memory cells) reach the lockout condition at a high or intermediate Vth. As a result, these memory cells are programmed to a relatively high position in the Vth distribution. The slow programming memory cells (which are likely to be the low Tco memory cells) reach the lockout condition when using the nominal sense time.

This example uses three sense times for each programmed data state. Other options can use two or more sense times for each data state. Also, multiple sense times can be used for fewer than all programmed data states. Further, the increment between the high sense time and the nominal sense time can be a function of the data state.

The increment between the high sense time and the nominal sense time can also be a function of temperature. For example, the increment may be greater when the temperature is colder. The number of sense times can also differ for different data states. Also, while the sense time steps down in each program loop from a high level to the nominal level in this example, the high or intermediate sense times can be repeated in multiple adjacent program loops before stepping down in a next program loop.

Similar approaches can be used in FIG. 16B.

FIG. 16B depicts a plot of sense time versus program loop number for use in the process of FIG. 13D, Option 2, where the programming is performed at a high temperature. For the verify tests of each data state, the sense time starts at a low level, ST_low, and steps up to a nominal level, ST_nom, respectively, for states A-G as successive program loops are performed. For example, for the A state verify tests, ST_low is applied in PL1, an intermediate ST (between ST_low and ST_nom) is applied in PL2 and ST_nom is applied in PL3-5. Similarly, for the B state verify tests, ST_low is applied in PL4, the intermediate ST is applied in PL5 and ST_nom is applied in PL6-8.

For the C state verify tests, ST_low is applied in PL7, the intermediate ST is applied in PL8 and ST_nom is applied in PL9-11. For the D state verify tests, ST_low is applied in PL10, the intermediate ST is applied in PL11 and ST_nom is applied in PL12-14. For the E state verify tests, ST_low is applied in PL13, the intermediate ST is applied in PL14 and ST_nom is applied in PL15-17. For the F state verify tests, ST_low is applied in PL16, the intermediate ST is applied in PL17 and ST_nom is applied in PL18-20. For the G state verify tests, ST_low is applied in PL19, the intermediate ST is applied in PL20 and ST_nom is applied in PL21 and 22.

By using a low sense time and then an intermediate sense time in the initial program loops for a data state, the faster programming memory cells (which are likely to be the high Tco memory cells) reach the lockout condition at a low or intermediate Vth. As a result, these memory cells are programmed to a relatively low position in the Vth distribution. The slow programming memory cells (which are likely to be the low Tco memory cells) reach the lockout condition when using the nominal sense time.

The increment between the low sense time and the nominal sense time can also be a function of temperature. For example, the increment may be greater when the temperature is hotter, e.g., above an upper temperature threshold such as 40 C. The increment may become progressively greater as the temperature becomes progressively hotter. Also, while the sense time steps up in successive program loops from a low level to the nominal level in this example, the low or intermediate sense times can be repeated in multiple adjacent program loops before stepping up in a next program loop.

Figure 17A:
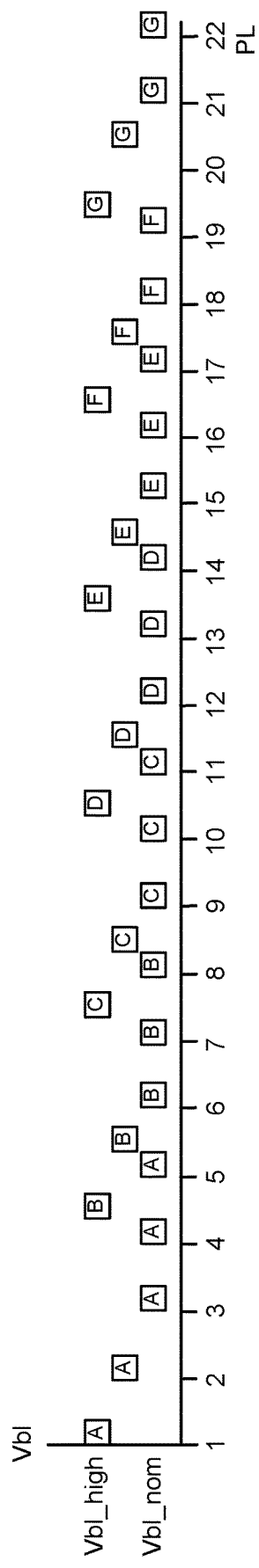
FIG. 17A depicts a plot of bit line voltage during sensing versus program loop number for use in the process of FIG. 13D, Option 3, where the programming is performed at a low temperature.
Figure 17B:
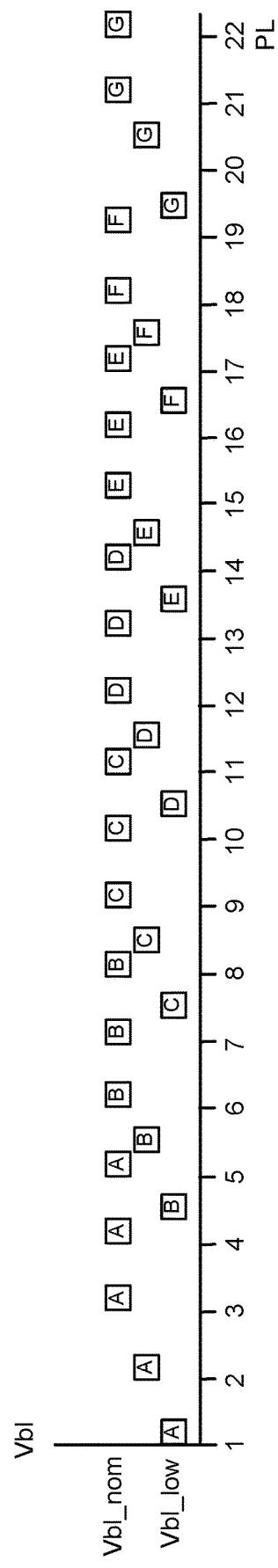
FIG. 17B depicts a plot of bit line voltage during sensing versus program loop number for use in the process of FIG. 13D, Option 3, where the programming is performed at a high temperature.

FIG. 17A depicts a plot of bit line voltage during sensing versus program loop number for use in the process of FIG. 13D, Option 3, where the programming is performed at a low temperature. In FIGS. 17A and 17B, the vertical axis represents a bit line voltage (Vbl) and the horizontal axis represents a program loop number. Each square represents a Vbl for an assigned data state, A-G, in this example. FIGS. 17A and 17B are also consistent with FIGS. 14A and 14B. For the verify tests of each data state, the Vbl starts at a high level, Vbl_high, and steps down to a nominal level, Vbl_nom, respectively, for states A-G as successive program loops are performed. For example, for the A state verify tests, Vbl_high is applied in PL1, an intermediate Vbl (between Vbl_high and Vbl_nom) is applied in PL2 and Vbl_nom is applied in PL3-5. Similarly, for the B state verify tests, Vbl_high is applied in PL4, the intermediate Vbl is applied in PL5 and Vbl_nom is applied in PL6-8.

For the C state verify tests, Vbl_high is applied in PL7, the intermediate Vbl is applied in PL8 and Vbl_nom is applied in PL9-11. For the D state verify tests, Vbl_high is applied in PL10, the intermediate Vbl is applied in PL11 and Vbl_nom is applied in PL12-14. For the E state verify tests, Vbl_high is applied in PL13, the intermediate Vbl is applied in PL14 and Vbl_nom is applied in PL15-17. For the F state verify tests, Vbl_high is applied in PL16, the intermediate Vbl is applied in PL17 and Vbl_nom is applied in PL18-20. For the G state verify tests, Vbl_high is applied in PL19, the intermediate Vbl is applied in PL20 and Vbl_nom is applied in PL21 AND 22.

By applying a high Vbl and then an intermediate Vbl in the initial program loops for a data state, the faster programming memory cells (which are likely to be the high Tco memory cells) reach the lockout condition at a high or intermediate Vth. As a result, these memory cells are programmed to a relatively high position in the Vth distribution. The slow programming memory cells (which are likely to be the low Tco memory cells) reach the lockout condition when using the nominal Vbl.

This example uses two Vbls for each programmed data state. Other options can use two or more Vbls for each data state. Also, multiple Vbls can be used for fewer than all programmed data states. Further, the increment between the high Vbl and the nominal Vbl can be a function of the data state.

The increment between the high Vbl and the nominal Vbl can also be a function of temperature. For example, the increment may be greater when the temperature is colder. The number of Vbls can also differ for different data states. Also, while the Vbl steps down in each program loop from a high level to the nominal level in this example, the high or intermediate Vbls can be repeated in multiple adjacent program loops before stepping down in a next program loop.

Similar approaches can be used in FIG. 17B.

FIG. 17B depicts a plot of bit line voltage during sensing versus program loop number for use in the process of FIG. 13D, Option 3, where the programming is performed at a high temperature. For the verify tests of each data state, the Vbl starts at a low level, Vbl_low, and steps up to a nominal level, Vbl_nom, respectively, for states A-G as successive program loops are performed. For example, for the A state verify tests, Vbl_low is applied in PL1, an intermediate Vbl (between Vbl_low and Vbl_nom) is applied in PL2 and Vbl_nom is applied in PL3-5. Similarly, for the B state verify tests, Vbl_low is applied in PL4, the intermediate Vbl is applied in PL5 and Vbl_nom is applied in PL6-8.

For the C state verify tests, Vbl_low is applied in PL7, the intermediate Vbl is applied in PL8 and Vbl_nom is applied in PL9-11. For the D state verify tests, Vbl_low is applied in PL10, the intermediate Vbl is applied in PL11 and Vbl_nom is applied in PL12-14. For the E state verify tests, Vbl_low is applied in PL13, the intermediate Vbl is applied in PL14 and Vbl_nom is applied in PL15-17. For the F state verify tests, Vbl_low is applied in PL16, the intermediate Vbl is applied in PL17 and Vbl_nom is applied in PL18-20. For the G state verify tests, Vbl_low is applied in PL19, the intermediate Vbl is applied in PL20 and Vbl_nom is applied in PL21 and 22.

By applying a low Vbl and then an intermediate Vbl in the initial program loops for a data state, the faster programming memory cells (which are likely to be the high Tco memory cells) reach the lockout condition at a low or intermediate Vth. As a result, these memory cells are programmed to a relatively low position in the Vth distribution. The slow programming memory cells (which are likely to be the low Tco memory cells) reach the lockout condition when using the nominal Vbl.

The increment between the low Vbl and the nominal Vbl can be a function of the data state.

The increment between the low Vbl and the nominal Vbl can also be a function of temperature. For example, the increment may be greater when the temperature is hotter. Also, while the Vbl steps up in each program loop from a low level to the nominal level in this example, the low or intermediate Vbls can be repeated in multiple adjacent program loops before stepping up in a next program loop.

Figure 18:
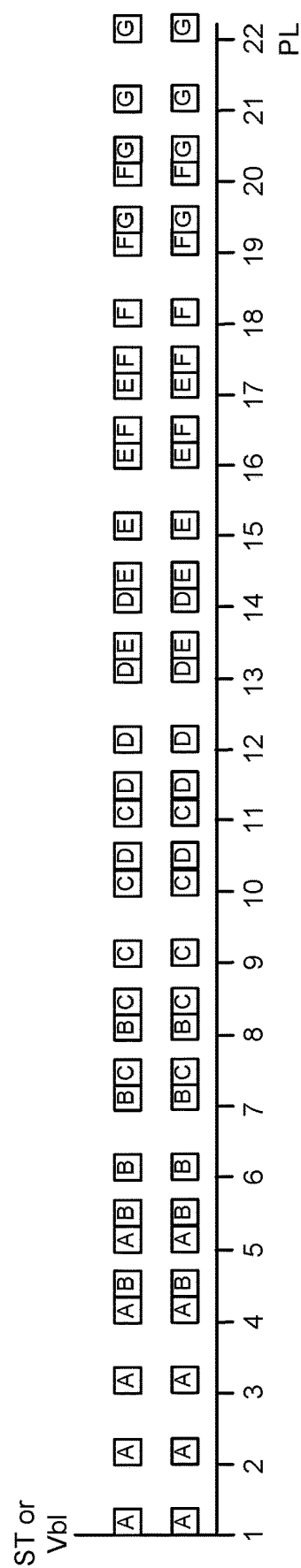
FIG. 18 depicts a plot of sense time or bit line voltage versus program loop number for use in the process of FIG. 13D, Option 3.

FIG. 18 depicts a plot of sense time or bit line voltage versus program loop number for use in the process of FIG. 13D, Option 3. In this case, when the programming occurs at a low temperature, the memory cells classified as having a high Tco are verified using the high ST and/or Vbl so that they will lockout at a high Vth for the assigned data state, and the memory cells classified as having a low Tco are verified using the low ST and/or Vbl so that they will lockout at a low Vth for the assigned data state. When the programming occurs at a high temperature, the memory cells classified as having a high Tco are verified using the low ST and/or Vbl so that they will lockout at a low Vth for the assigned data state, and the memory cells classified as having a low Tco are verified using the high ST and/or Vbl so that they will lockout at a high Vth for the assigned data state.

In one approach, ST_high and/or Vbl_high and ST_low and/or Vbl_low are used in each program loop. In each program loop, for an assigned data state, the memory cells classified as having a high or low Tco can be verified concurrently since a common word line verify voltage is used and since each memory cell is in a separate NAND string which is connected to a respective sense circuit. The corresponding ST or Vbl for a memory cell can be determined by reading the data in the corresponding TCO latch of the NAND string to determine the Tco classification and reading data in the latches which identify the assigned data state. A verify test is performed when the corresponding VWLn is applied, assuming the memory cell has not yet reached the lockout condition.

The A, B, C, D, E, F and G states are verified in program loops 1-5, 4-8, 7-11, 10-14, 13-17, 16-20 and 19-22, respectively.

FIG. 19A depicts an example of bit values in latches at a start of a program operation, consistent with the processes of FIG. 10B-10D, where a TCO latch is used to store data indicating the Tco classification of a memory cell. As mentioned, e.g., in connection with FIG. 2, a set of latches can be associated with each NAND string and thus with each selected memory cell being programmed. A bit combination stored in the latches can identify the assigned data state and/or indicate that the memory cell is in a lockout or program state. The UP/MP/LP bit combinations of 111, 110, 100, 000, 010, 011, 001 and 101 identify the Er, A, B, C, D, E, F and G states, respectively, as assigned data states. The bit combination of 111 also identifies the lockout state. During programming, when the memory cells reach their respective lockout state, the bit combination can be changed to 111 as indicated in FIG. 19B. Additionally, the TCO latch holds a 0 or 1 bit to identify a low or high Tco, respectively, for example. As mentioned, more than one TCO latch can be used per NAND string to hold more than one bit, to thereby allow additional Tco classifications and a finer grained approach to adjusting the lockout condition based on the Tco classification.

FIG. 19B depicts bit values in latches at a completion of a program operation, consistent with FIG. 19A. As mentioned, the bit combination 111 denotes the lockout state.

Accordingly, it can be seen that in one implementation, an apparatus comprises: a word line, a set of memory cells connected to the word line, wherein different memory cells in the set of memory cells have different temperature coefficients; a temperature-sensing circuit configured to provide an indication of a temperature; and a control circuit connected to the word line and the temperature-sensing circuit, the control circuit is configured to program threshold voltages of the different memory cells to different positions in a threshold voltage distribution according to the different temperature coefficients and the temperature.

In another implementation, a method comprises: applying a program pulse to a set of memory cells connected to a word line in each program loop of a plurality of program loops, wherein the set of memory cells comprises memory cells assigned to a data state; and performing a verify test for the memory cells which are assigned to the data state in successive program loops of the plurality of program loops, wherein the verify test is different for different memory cells among the memory cells assigned to the data state according to a temperature.

In another implementation, an apparatus comprises: a word line, memory cells connected to the word line; and a control circuit connected to the word line, the control circuit is configured to, for each memory cell, sense the memory cell, assign the memory cell to a group among a plurality of groups based on the sensing, and program the memory cell using a verify test which is a function of the group.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells connected to a word line, wherein different memory cells in the set of memory cells have different temperature coefficients, each of the different memory cells is in a respective NAND string, and each NAND string is connected to a respective bit line;
a temperature-sensing circuit configured to provide an indication of a temperature; and
a control circuit configured to connect to the word line and the temperature-sensing circuit, the control circuit is configured to program threshold voltages of the different memory cells to different positions in a threshold voltage distribution according to the different temperature coefficients and the temperature;
the control circuit, to program the threshold voltages of the different memory cells to the different positions in the threshold voltage distribution, is configured to perform a plurality of program-verify iterations;
in each program-verify iteration, a program pulse is applied to the word line after which a verify pulse for a data state is applied to the word line while sensing is performed; and
the sensing uses a bit line voltage which changes over successive program-verify iterations of the plurality of program-verify iterations, wherein the bit line voltage decreases over the successive program-verify iterations when the temperature is below a lower temperature threshold, and the bit line voltage increases over the successive program-verify iterations when the temperature is above an upper temperature threshold.

2. The apparatus of claim 1, wherein:
the verify pulses for the data state change over successive program-verify iterations of the plurality of program-verify iterations; and
an amount of the change in the verify pulses is a function of the temperature.

3. The apparatus of claim 1, wherein:
the verify pulses for the data state decrease in magnitude over successive program-verify iterations of the plurality of program-verify iterations when the temperature is below a lower temperature threshold.

4. The apparatus of claim 1, wherein:
the verify pulses for the data state increase in magnitude over successive program-verify iterations of the plurality of program-verify iterations when the temperature is above an upper temperature threshold.

5. The apparatus of claim 1, wherein:
over successive program-verify iterations of the plurality of program-verify iterations, the sensing uses a sense time which decreases when the temperature is below a lower temperature threshold and increases when the temperature is above an upper temperature threshold.

6. The apparatus of claim 1, wherein:
the control circuit is configured to classify the different memory cells into different groups according to the different temperature coefficients; and
the threshold voltages of the different memory cells are programmed to the different positions in the threshold voltage distribution according to the different groups.

7. The apparatus of claim 6, wherein:
the classifying of the different memory cells and the programming of the threshold voltages of the different memory cells occur in a single program pass.

8. The apparatus of claim 6, wherein:
the control circuit is configured to erase the different memory cells after the classifying of the different memory cells and before the programming of the threshold voltages of the different memory cells to the different positions in the threshold voltage distribution.

9. A method, comprising:
applying a program pulse to a set of memory cells connected to a word line in each program loop of a plurality of program loops, wherein the set of memory cells comprises memory cells assigned to a common data state; and
performing a verify test for the memory cells which are assigned to the common data state in successive program loops of the plurality of program loops, wherein the verify test is different for different memory cells among the memory cells assigned to the common data state according to a temperature, the performing the verify test comprises applying a verify pulse for the common data state to the set of memory cells, the verify pulse for the common data state decreases in magnitude over the successive program loops when the temperature is below a lower temperature threshold, and increases in magnitude over the successive program loops when the temperature is above an upper temperature threshold.

10. The method of claim 9, wherein:
the different memory cells have different temperature coefficients; and
the verify test is different for the different memory cells according to the different temperature coefficients.

11. The method of claim 9, wherein the different memory cells have different temperature coefficients, the method further comprising:
classifying the different memory cells into different groups according to the different temperature coefficients, wherein the verify test is different for the different memory cells according to the different groups.

12. An apparatus, comprising:
a control circuit configured to connect to memory cells associated with a word line, each memory cell is in a respective NAND string connected to a respective latch, the control circuit is configured to:
program the memory cells to a threshold voltage distribution; and
for each memory cell:
sense the memory cell while it is in the threshold voltage distribution;
assign the memory cell to a group among a plurality of groups based on the sensing;
store data in the respective latch indicating a group into which the memory cell is classified; and
program the memory cell using a verify test which is a function of the group as indicated by the data in the respective latch.

13. The apparatus of claim 12, wherein:
the control circuit, to use the verify test which is the function of the group for each memory cell, is configured to sense the memory cell using a sense time which is a function of the group.

14. The apparatus of claim 12, wherein:
each of the memory cells is in a respective NAND string;
each NAND string is connected to a respective bit line; and
the control circuit, to use the verify test which is the function of the group for each memory cell, is configured to sense the memory cell using a bit line voltage which is a function of the group.

15. The apparatus of claim 12, wherein:
the control circuit, to use the verify test which is the function of the group for each memory cell, is configured to sense the memory cell while a verify voltage which is a function of the group is applied to the word line.

16. The method of claim 11, wherein:

the classifying the different memory cells into different groups according to the different temperature coefficients comprises classifying the different memory cells into different groups according to different program speeds.

17. The apparatus of claim 12, wherein:

the control circuit is configured to connect to memory cells associated with another word line;

each memory cell of the another word line is in one of the respective NAND strings; and for each memory cell connected to the another word line, the control circuit is configured to program the memory cell using a verify test which is a function of the group as indicated by the data in the respective latch of the one of the respective NAND strings.

18. The apparatus of claim 13, wherein:

for each memory cell, the sensing uses a first sensing condition and a second sensing condition, and the assigning of the memory cell to a group is a function of a difference in threshold voltage of the memory cell when sensed using the first sensing condition compared to when sensed using the second sensing condition.

19. The apparatus of claim 18, wherein:

the first sensing condition comprises a first sense time and the second sensing condition comprises a second sense time.

20. The apparatus of claim 18, wherein:

the first sensing condition comprises a first bit line voltage and the second sensing condition comprises a second bit line voltage.

\* \* \* \* \*